(12) United States Patent
Jin

(10) Patent No.: US 11,183,384 B2
(45) Date of Patent: Nov. 23, 2021

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 160 days.

(21) Appl. No.: 16/715,328

(22) Filed: Dec. 16, 2019

(65) Prior Publication Data
US 2020/0279740 A1      Sep. 3, 2020

(30) Foreign Application Priority Data
Mar. 1, 2019 (CN) .......................... 201910155858.8

(51) Int. Cl.
| | |
|---|---|
| *H01L 21/033* | (2006.01) |
| *H01L 21/3115* | (2006.01) |
| *H01L 21/768* | (2006.01) |
| *H01L 21/027* | (2006.01) |
| *H01L 21/4757* | (2006.01) |

(Continued)

(52) U.S. Cl.
CPC ...... *H01L 21/0338* (2013.01); *H01L 21/0276* (2013.01); *H01L 21/0332* (2013.01); *H01L 21/0335* (2013.01); *H01L 21/0337* (2013.01); *H01L 21/3088* (2013.01); *H01L 21/31155* (2013.01); *H01L 21/3215* (2013.01); *H01L 21/47576* (2013.01)

(58) Field of Classification Search
CPC ............ H01L 21/0338; H01L 21/0276; H01L 21/0332; H01L 21/0335; H01L 21/0337; H01L 21/31155; H01L 21/3215; H01L 21/3088; H01L 21/47576
USPC ......................................... 438/667; 257/618
See application file for complete search history.

(56) References Cited

U.S. PATENT DOCUMENTS

| | | | | |
|---|---|---|---|---|
| 8,298,943 B1 * | 10/2012 | Arnold | .............. | H01L 21/76811 438/667 |
| 10,635,007 B1 * | 4/2020 | Yang | ..................... | H01L 23/544 |
| 2017/0125248 A1 * | 5/2017 | Siew | ................... | H01L 21/0335 |

* cited by examiner

*Primary Examiner* — David Vu
*Assistant Examiner* — Brandon C Fox
(74) *Attorney, Agent, or Firm* — Anova Law Group, PLLC

(57) ABSTRACT

A semiconductor device and a method for forming the semiconductor device are provided. The method includes providing a layer to-be-etched including first regions and second regions. A second region includes a second trench region. The method also includes forming a first mask layer over the first and second regions, and forming first trenches discretely in the first mask layer in the first regions. Moreover, the method includes forming a divided doped layer, and implanting dopant ions into the first mask layer disposed outside the second trench region. In addition, the method includes forming a mask sidewall spacer on a sidewall of a first trench after forming the divided doped layer and implanting the dopant ions into the first mask layer disposed outside the second trench region. Further, the method includes forming a second trench in the first mask layer in the second region.

20 Claims, 17 Drawing Sheets

(51) Int. Cl.
*H01L 21/3215* (2006.01)
*H01L 21/308* (2006.01)

SEMICONDUCTOR DEVICE AND FABRICATION METHOD THEREOF

CROSS-REFERENCES TO RELATED APPLICATIONS

This application claims the priority of Chinese patent application No. 201910155858.8, filed on Mar. 1, 2019, the entirety of which is incorporated herein by reference.

FIELD OF THE DISCLOSURE

The present disclosure generally relates to the field of semiconductor manufacturing and, more particularly, relates to a semiconductor device and fabrication method thereof.

BACKGROUND

In a semiconductor device manufacturing process, a pattern of a mask is often transferred to a substrate using a photolithography process. The photolithography process includes providing a substrate and forming a photoresist layer on the substrate. The photolithography process also includes exposing and developing the photoresist layer to form a patterned photoresist layer, such that the pattern of the mask is transferred to the photoresist layer. Further, the photolithography process includes etching the substrate by using the patterned photoresist layer as a mask to transfer the pattern on the photoresist layer to the substrate, followed by removing the photoresist layer.

As the size of the semiconductor device continues to shrink, the critical dimension in photolithography gradually approaches or even exceeds the physical limits of photolithography, which poses substantially serious challenges for photolithography. A basic idea of double patterning technique is to form an ultimate target pattern by patterning twice to overcome the photolithography limit that cannot be achieved by patterning once.

However, the performance of the conventional semiconductor device is poor and still needs to be improved. The disclosed methods and device structures are directed to solve one or more problems set forth above and other problems.

BRIEF SUMMARY OF THE DISCLOSURE

One aspect of the present disclosure includes a method for fabricating a semiconductor device. The method includes providing a layer to-be-etched. The layer to-be-etched includes first regions and second regions, alternately arranged along a first direction. A first region is in contact with an adjacent second region, and a second region includes a second trench region. The method also includes forming a first mask layer over the first regions and the second regions of the layer to-be-etched, and forming first trenches discretely in the first mask layer in the first regions. Moreover, the method includes forming a divided doped layer by implanting dopant ions into a portion region of the first mask layer in the second region. The divided doped layer is disposed between adjacent first trenches in the first direction and divides the first mask layer in the second trench region in a second direction. The second direction is perpendicular to the first direction. In addition, the method includes implanting dopant ions into the first mask layer disposed outside the second trench region, and forming a mask sidewall spacer on a sidewall of a first trench after forming the divided doped layer and implanting the dopant ions into the first mask layer disposed outside the second trench region. Further, the method includes after forming the mask sidewall spacer, removing the first mask layer in the second trench region by etching to form a second trench in the first mask layer in the second region. The second trench is disposed on both sides of the divided doped layer in the second direction, and a sidewall of the second trench exposes the mask sidewall spacer.

Another aspect of the present disclosure includes a semiconductor device. The semiconductor device includes a substrate including first regions and second regions that are alternately arranged along a first direction. A first region is in contact with an adjacent second region, and a second region includes a second trench region. The semiconductor device also includes a first mask layer disposed over the first regions and the second regions of the substrate, and discrete first trenches disposed in the first mask layer in the first regions. Moreover, the semiconductor device includes a divided doped layer disposed between adjacent first trenches in the first direction, and a mask sidewall spacer disposed on a sidewall of a first trench. The mask sidewall spacer is formed after forming the divided doped layer and implanting dopant ions into the first mask layer disposed outside the second trench region. Further, the semiconductor device includes a second trench disposed in the first mask layer in the second region. The second trench is disposed on both sides of the divided doped layer in the second direction, and a sidewall of the second trench exposes the mask sidewall spacer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
FIGS. 1-5 illustrate semiconductor structures corresponding to certain stages for forming a semiconductor device.

FIGS. 1-5 illustrate semiconductor structures corresponding to certain stages for forming a semiconductor device. Referring to FIG. 1, a layer 100 to-be-etched is provided. The layer 100 to-be-etched includes a plurality of discrete first regions A01 and a plurality of discrete second regions A02. The first regions A01 and the second regions A02 are alternately arranged along a first direction X. The first region A01 is in contact with an adjacent second region A02, and the second region A02 includes a first trench region.

Figure 2:
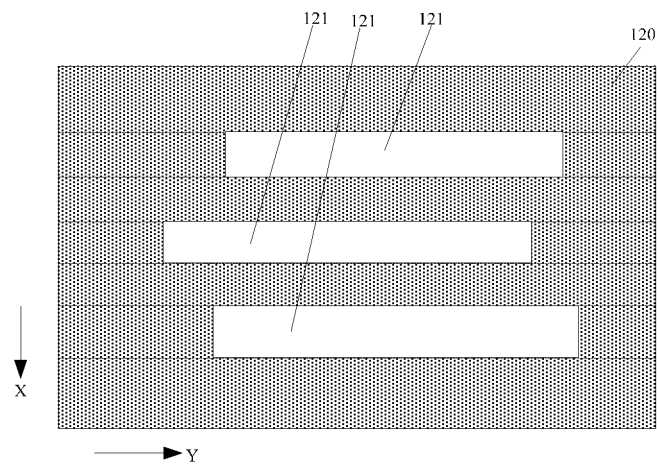

Referring to FIG. 2, a first mask layer 120 is formed on the first region A01 and the second region A02 of the layer 100 to-be-etched. A discrete first trench 121 is formed in the first mask layer 120 in the first region A01.

Figure 3:
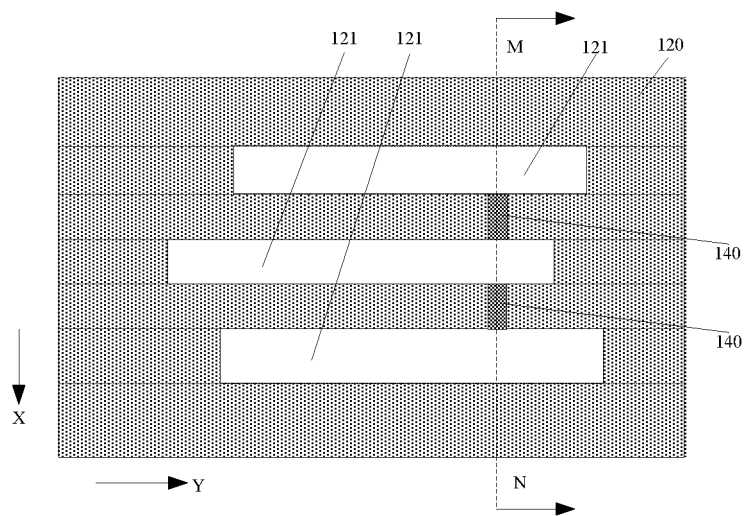

Referring to FIG. 3, dopant ions are implanted into a portion of the first mask layer 120 in a second trench region to form a divided doped layer 140. The divided doped layer 140 divides the first mask layer 120 in the second trench region in a second direction Y. The second direction Y is perpendicular to the first direction X, and the divided doped layer 140 is disposed between adjacent first trenches 121 in the first direction X.

Figure 4:
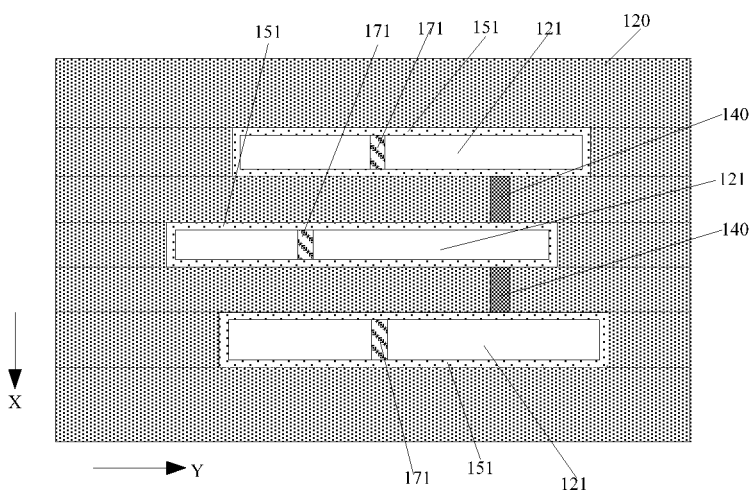

Referring to FIG. 4, after forming the divided doped layer 140, a mask sidewall spacer 151 is formed on the sidewall of the first trench 121, and a divided filling layer 171 is formed in the first trench 121. The divided filling layer 171 divides the first trench 121 in the second direction Y.

Figure 5:
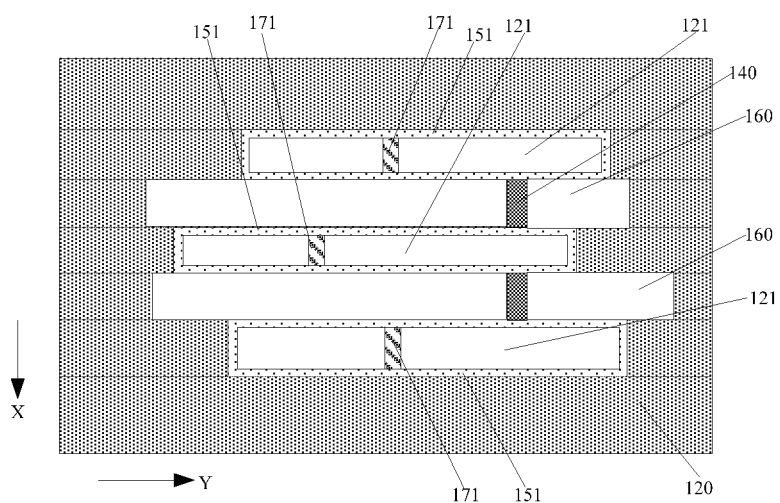

Referring to FIG. 5, after forming the divided filling layer 171 and the mask sidewall spacer 151, dopant ions are implanted into the first mask layer 120 outside the second trench region. The first mask layer 120 in the second trench region on both sides of the divided doped layer 140 is removed by etching to form a second trench 160. The second trenches 160 are respectively disposed on both sides of the divided doped layer 140 in the second direction Y, and the sidewall of the second trench 160 exposes the mask sidewall spacer 151.

Because dopant ions are implanted into the first mask layer 120 outside the second trench region after forming the mask sidewall spacer 151, dopant ions are also easily implanted into the mask sidewall spacer 151, thereby causing the etching performance of the mask sidewall spacer 151 to change. If the etching resistance performance of the mask sidewall spacer 151 degrades, the stability of transferring pattern by thickness decreases, which causes a decrease in the performance of the semiconductor device.

The present disclosure provides a method for forming a semiconductor device. The method may include forming a discrete first trench in a first mask layer in a first region, and implanting dopant ions into a portion of the first mask layer in a second region to form a divided doped layer. The divided doped layer may be disposed between adjacent first trenches in a first direction, and may divide the first mask layer in the second trench region in a second direction, where the second direction may be perpendicular to the first direction. The method may also include implanting dopant ions into the first mask layer outside the second trench region. Moreover, after forming the divided doped layer and implanting dopant ions into the first mask layer outside the second trench region, the method may include forming a mask sidewall spacer on the sidewall of the first trench. After forming the mask sidewall spacer, the method may further include removing the first mask layer in the second trench region by etching to form a second trench in the first mask layer in the second region. The second trenches may be respectively disposed on both sides of the divided doped layer in the second direction, and the sidewall of the second trench may expose the mask sidewall spacer. The performance of the semiconductor device formed by such method may be improved.

Figure 42:
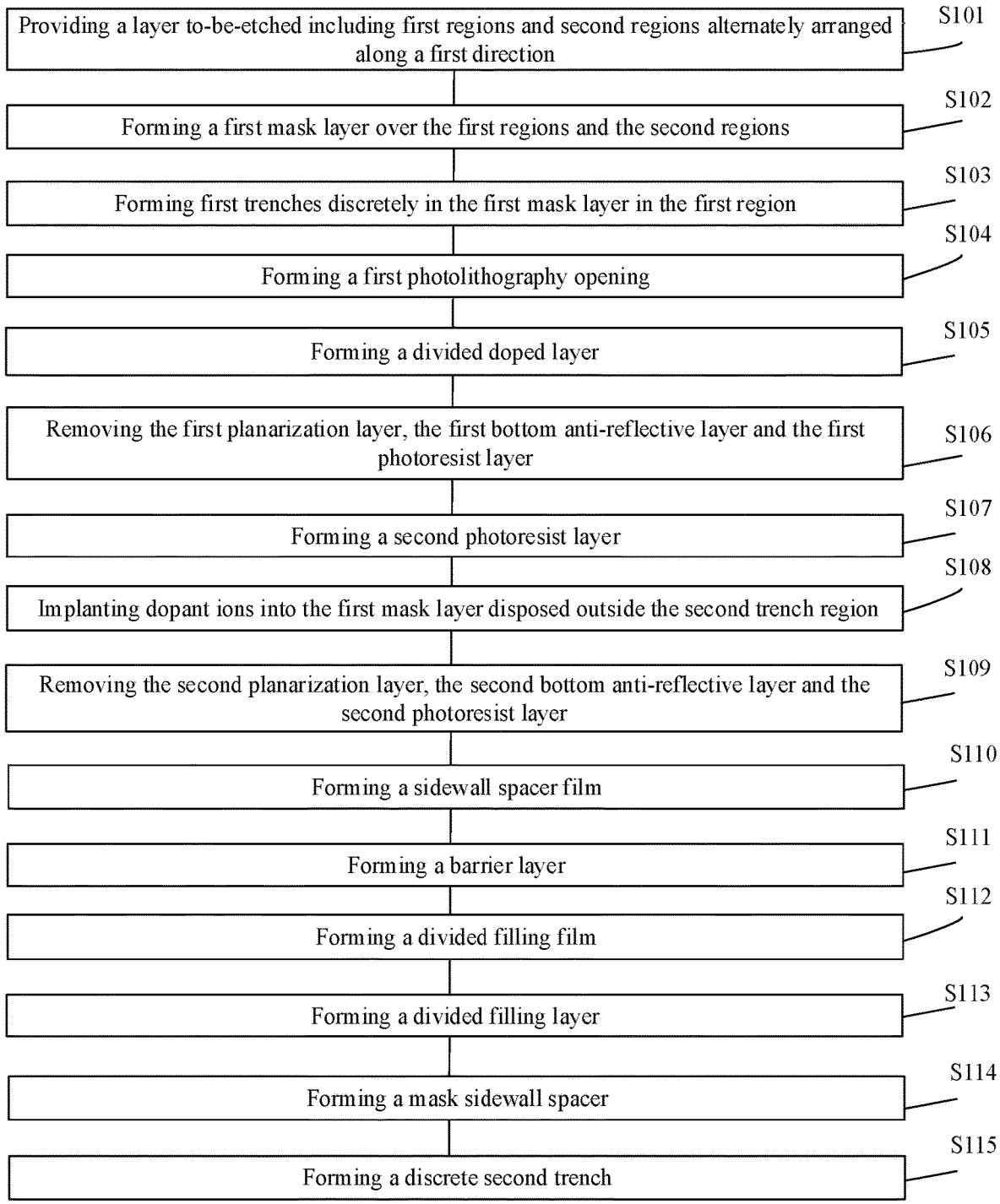
FIG. 42 illustrates an exemplary method for forming a semiconductor device consistent with various disclosed embodiments of the present disclosure.

FIG. 42 illustrates an exemplary method for forming a semiconductor device consistent with various disclosed embodiments of the present disclosure; and FIGS. 6-38 illustrate semiconductor structures corresponding to certain stages of the exemplary fabrication method.

Figure 6:
FIGS. 6-38 illustrate semiconductor structures corresponding to certain stages for forming an exemplary semiconductor device consistent with various disclosed embodiments of the present disclosure.

As shown in FIG. 42, at the beginning of the fabrication method, a layer to-be-etched may be provided (S101). FIG. 6 illustrates a corresponding semiconductor structure.

Referring to FIG. 6, a layer 200 to-be-etched may be provided. The layer 200 to-be-etched may include a plurality of discrete first regions A1 and a plurality of discrete second regions A2. The first regions A1 and the second regions A2 may be alternately arranged along a first direction X, and the first region A1 may be adjacent to and in contact with an adjacent second region A2.

The plurality of first regions A1 may be arranged along the first direction X, and the plurality of second regions A2 may be arranged along the first direction X. The alternate arrangement of the first regions A1 and the second regions A2 in the first direction X may refer to that merely one second region is disposed between adjacent first regions, and merely one first region is disposed between adjacent second regions.

The second region A2 may include a second trench region for defining a position of a subsequently formed second trench. The second trench region may be disposed adjacent to and in contact with the first region, and the second trench region may be disposed on a side of a first trench in the first direction X.

In one embodiment, a quantity of the first regions may be equal to a quantity of the second regions. The layer 200 to-be-etched may be made of a material including silicon oxide or a low-K dielectric layer (dielectric constant K is 3.9 or less).

Figure 7:
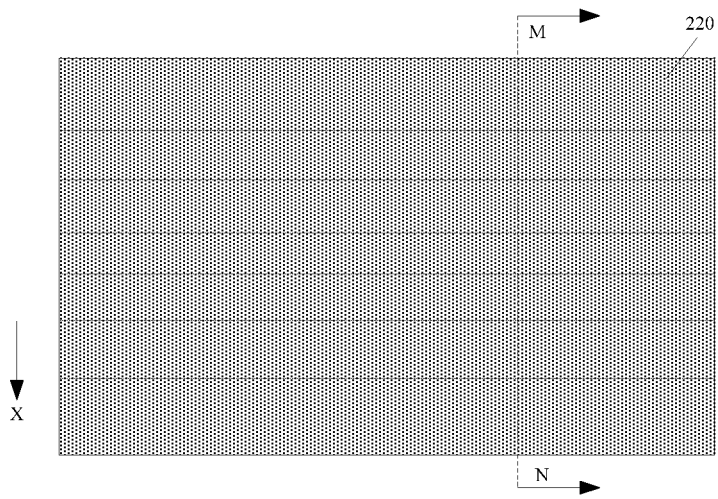
Figure 8:
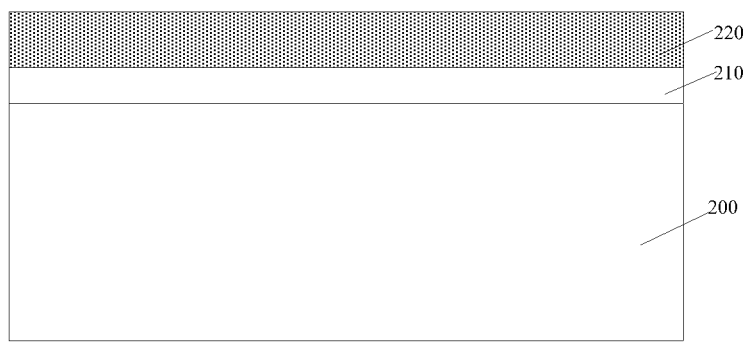

Returning to FIG. 42, after providing the layer to-be-etched, a first mask layer may be formed (S102). FIGS. 7-8 illustrate a corresponding semiconductor structure. FIG. 7 illustrates a schematic diagram formed on the basis of FIG. 6, and FIG. 8 illustrates a cross-sectional view along a line 'M-N' in FIG. 7.

Referring to FIGS. 7-8, a first mask layer 220 may be formed over the first region A1 and the second region A2 of the layer 200 to-be-etched. In one embodiment, the first mask layer 220 may be made of a material including amorphous silicon.

In one embodiment, the method may further include: forming a first adhesive layer (not illustrated) on the layer 200 to-be-etched before forming the first mask layer 220; forming a bottom hard mask layer 210 on the first adhesive layer; forming a second adhesive layer (not illustrated) on the bottom hard mask layer 210; and forming the first mask layer 220 on the second adhesive layer.

The bottom hard mask layer 210 may be made of a material including titanium nitride. The first adhesive layer may be made of a material including silicon oxycarbide (SiOC). The second adhesive layer may be made of a material including SiOC, tetraethyl orthosilicate (TEOS), poly(2-ethyl-2-oxazoline) (PEOX), silicon nitride (SiN), or tungsten carbide (WC).

The first adhesive layer may be used to improve the adhesion between the bottom hard mask layer 210 and the layer 200 to-be-etched, such that the bond between the bottom hard mask layer 210 and the layer 200 to-be-etched may be substantially strong. The second adhesive layer may be used to improve the adhesion between the first mask layer 220 and the bottom hard mask layer 210, such that the bond between the first mask layer 220 and the bottom hard mask layer 210 may be substantially strong.

The bottom hard mask layer 210 may be used as an etching stop layer. The bottom hard mask layer 210 may be used as a stop layer for subsequently planarizing a conductive film. The bottom hard mask layer 210 may be made of a hard mask material. When subsequently forming a first target trench and a second target trench by etching, the etching loss of the bottom hard mask layer 210 may be substantially small. Therefore, when transferring the pattern in the bottom hard mask layer 210 to the layer 200 to-be-etched, the stability of pattern transfer may be substantially high.

In one embodiment, the bottom hard mask layer 210 may be made of a material different from the first mask layer 220. In certain embodiments, the bottom hard mask layer, the first adhesive layer, and the second adhesive layer may not be formed.

Figure 9:
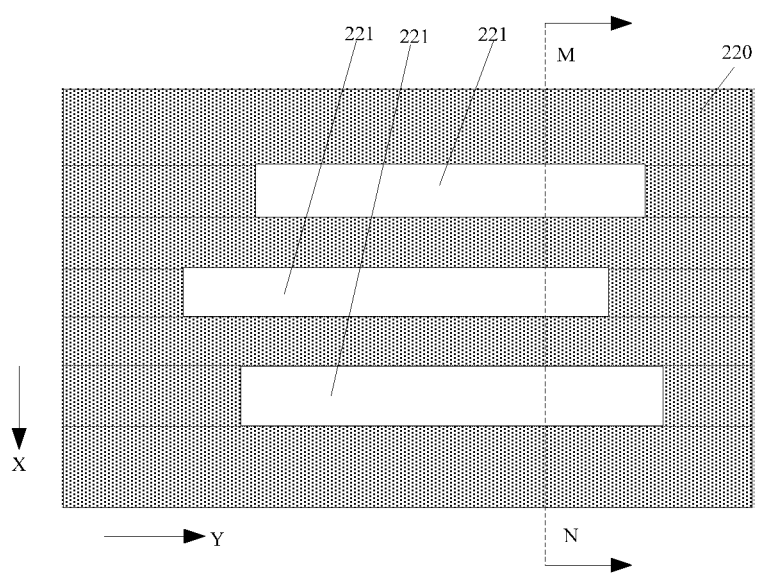
Figure 10:
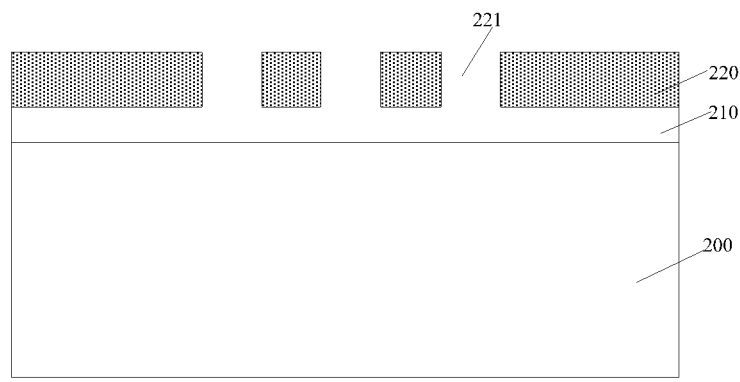

Returning to FIG. 42, after forming the first mask layer, a discrete first trench may be formed (S103). FIGS. 9-10 illustrate a corresponding semiconductor structure. FIG. 9 illustrates a schematic diagram formed on the basis of FIG. 7, and FIG. 10 illustrates a schematic diagram formed on the basis of FIG. 8. FIG. 10 illustrates a cross-sectional view along a line 'M-N' in FIG. 9.

Referring to FIGS. 9-10, a discrete first trench 221 may be formed in the first mask layer 220 in the first region A1. The first trench 221 may be extended along a second direction Y, and the second direction Y may be perpendicular to the first direction X. A width of the first trench 221 in the first direction X may be in a range of approximately 10 nm-60 nm. In the first direction X, a spacing between adjacent first trenches 221 may be in a range of approximately 10 nm-600 nm. In one embodiment, the spacing between adjacent first trenches 221 may be in a range of approximately 20 nm-60 nm. The process for forming the first trench 221 may include a dry etching process, e.g., an anisotropic dry etching process.

Then, dopant ions may be implanted into a portion of the first mask layer in the second region to form a divided doped layer. The divided doped layer may divide the first mask layer 220 in the second trench region in the second direction Y, and the second direction Y may be perpendicular to the first direction X. The divided doped layer may be disposed between adjacent first trenches 221 in the first direction X. Dopant ions may be implanted into the first mask layer 220 disposed outside the second trench region.

In one embodiment, after forming the divided doped layer, dopant ions may be implanted into the first mask layer 220 disposed outside the second trench region as an example for illustrative purposes. A method for forming the divided doped layer is described below with reference to FIGS. 11-16.

Figure 11:
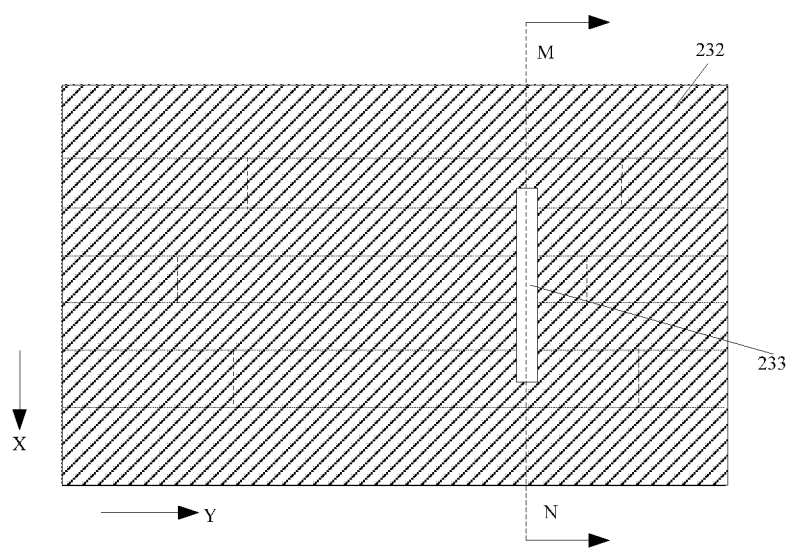
Figure 12:
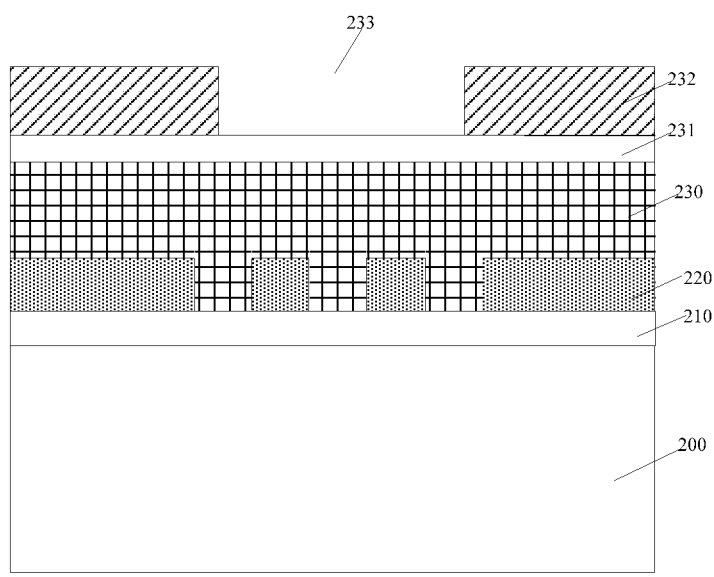

Returning to FIG. 42, after forming the discrete first trench, a first photolithography opening may be formed (S104). FIGS. 11-12 illustrate a corresponding semiconductor structure. FIG. 11 illustrates a schematic diagram formed on the basis of FIG. 9, and FIG. 12 illustrates a schematic diagram formed on the basis of FIG. 10. FIG. 12 illustrates a cross-sectional view along a line 'M-N' in FIG. 11.

Referring to FIGS. 11-12, a first planarization layer 230 may be formed on the first mask layer 220, and in and over the first trench 221. A first bottom anti-reflective layer 231 may be formed on the first planarization layer 230. A patterned first photoresist layer 232 may be formed on the first bottom anti-reflective layer 231, and the first photoresist layer 232 may include a first photolithography opening 233. The first photolithography opening 233 may be disposed over the second region A2 on a side of the first trench 221 along the first direction X, and the first photolithography opening 233 may also be extended to a portion region of the first trench 221.

An extension direction of the first photolithography opening 233 may be parallel to the first direction X. The first photolithography opening 233 may be extended to a portion region of the first trench 221 in the first direction X. An overlapped region between the first photolithography opening 233 and the first mask layer 220 disposed between adjacent first trenches 221 may be used to define a position of the subsequently formed divided doped layer.

A width of the first photolithography opening 233 in the second direction Y may be used to define the size of the subsequently formed divided doped layer in the second direction Y. Because the size of the divided doped layer in the second direction Y is substantially small, the width of the first photolithography opening 233 in the second direction Y may be substantially small. In one embodiment, the width of the first photolithography opening 233 in the second direction Y may be in a range of approximately 20 nm-600 nm. In one embodiment, the width of the first photolithography opening 233 in the second direction Y may be in a range of approximately 20 nm-60 nm, e.g., 20 nm, 30 nm, 40 nm, 50 nm, or 60 nm.

The first photolithography opening 233 may be extended to a portion region of the first trench 221 in the first direction X, such that the size of the first photolithography opening 233 in the first direction X may be made substantially large. Thus, the size of the first photolithography opening 233 in the second direction Y may desire to be defined substantially small, and the size thereof in the first direction X may not desire to be defined substantially small. Therefore, the challenge on the photolithography process may be reduced, and the process difficulty may be lowered. In one embodiment, the size of the first photolithography opening 233 in the first direction X may be in a range of approximately 65 nm-1000 nm, e.g., 80 nm, 100 nm, and 200 nm.

Figure 13:
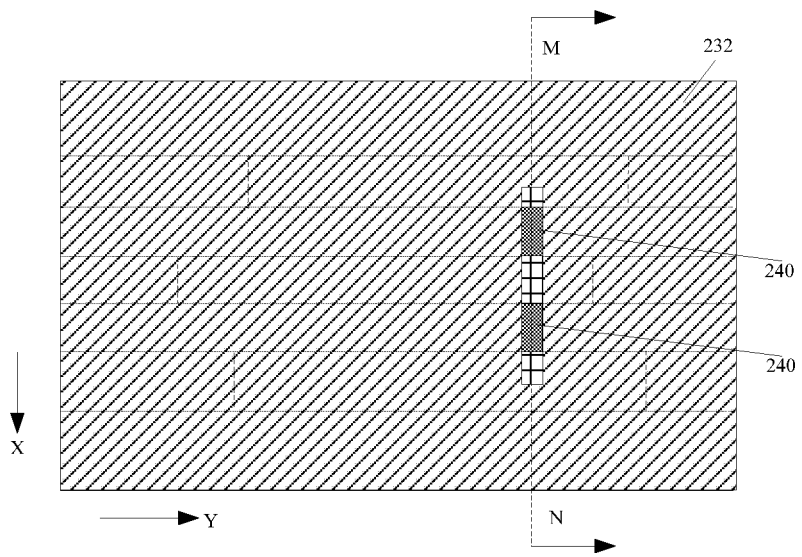
Figure 14:
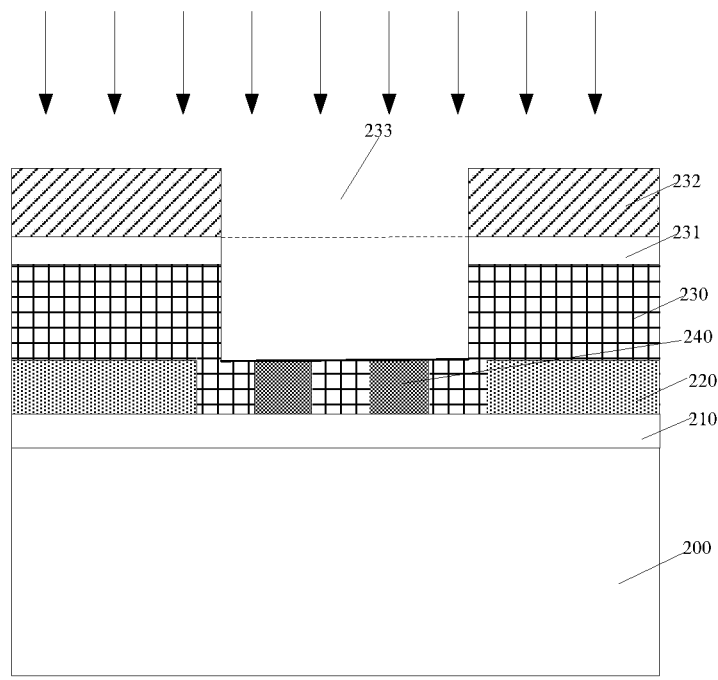

Returning to FIG. 42, after forming the first photolithography opening, a divided doped layer may be formed (S105). FIGS. 13-14 illustrate a corresponding semiconductor structure. FIG. 13 illustrates a schematic diagram formed on the basis of FIG. 11, and FIG. 14 illustrates a schematic diagram formed on the basis of FIG. 12. FIG. 14 illustrates a cross-sectional view along a line 'M-N' in FIG. 13.

Referring to FIGS. 13-14, using the first photoresist layer 232 as a mask, the first bottom anti-reflective layer 231 and the first planarization layer 230 at the bottom of the first photolithography opening 233 may be etched until a top surface of the first mask layer 220 is exposed. The first trench 221 may be filled with the first planarization layer 230. Then, using the first photoresist layer 232 and the first planarization layer 230 as a mask, dopant ions may be implanted into the first mask layer 220 at the bottom of the first photolithography opening 233 to form the divided doped layer 240 in the first mask layer 220 in the second region A2. The divided doped layer 240 may divide the first mask layer 220 in the second trench region in the second direction Y, and the divided doped layer 240 may be disposed between adjacent first trenches 221 in the first direction X.

Because the overlapped region between the first photolithography opening 233 and the first mask layer 220 disposed between adjacent first trenches 221 is used to define a position of the divided doped layer 240, the divided doped layer 240 may have a substantially small size in the first direction X. Because the width of the first photolithography opening 233 in the second direction Y is used to define the size of the divided doped layer 240 in the second direction Y, when the width of the first photolithography opening 233 in the second direction Y is substantially small, the divided doped layer 240 may have a substantially small size in the second direction Y.

In one embodiment, the divided doped layer 240 may not be extended to the first region A1, and, thus, the divided doped layer 240 may not affect the position at which the first trench is cut. In one embodiment, the size of the divided doped layer 240 in the first direction X may be in a range of approximately 10 nm-600 nm, and the size of the divided doped layer 240 in the second direction Y may be in a range of approximately 10 nm-400 nm.

The dopant ions may include boron ions or arsenic ions. In the process of implanting dopant ions into the first mask layer 220 at the bottom of the first photolithography opening 233 to form the divided doped layer 240, the first planarization layer 230 in the first trench 221 may block the dopant ions from being implanted into a material layer at the bottom of the first trench 221. To avoid dopant ions from being implanted into the material layer at the bottom of the first trench 221, the first planarization layer 230 in the first trench 221 may desire to be retained. Thus, the etching process may desire to be precisely controlled to avoid over-etching, which may cause the first planarization layer 230 in the first trench 221 to be consumed substantially large.

Figure 15:
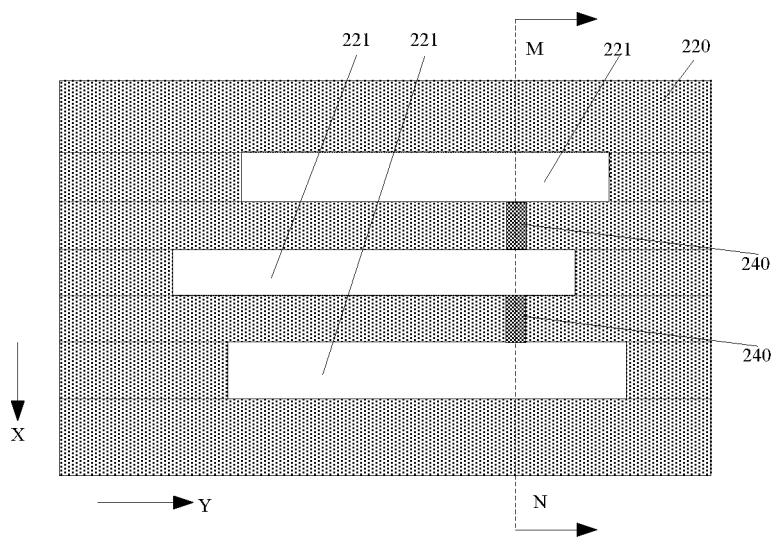
Figure 16:
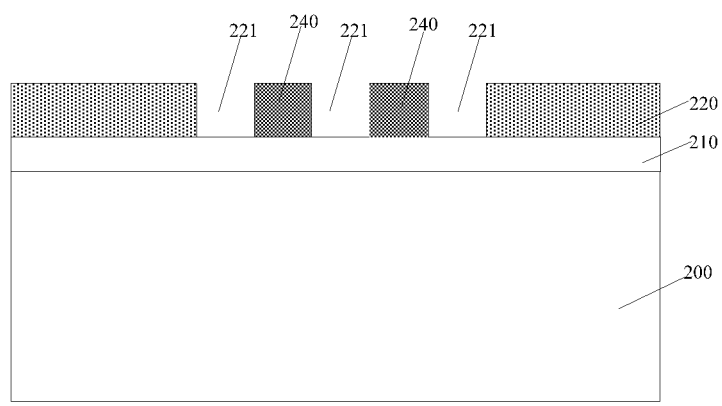

Returning to FIG. 42, after forming the divided doped layer, the first planarization layer, the first bottom anti-reflective layer and the first photoresist layer may be removed (S106). FIGS. 15-16 illustrate a corresponding semiconductor structure. FIG. 15 illustrates a schematic diagram formed on the basis of FIG. 13, and FIG. 16 illustrates a schematic diagram formed on the basis of FIG. 14. FIG. 16 illustrates a cross-sectional view along a line 'M-N' in FIG. 15.

Referring to FIGS. 15-16, after implanting the dopant ions into the first mask layer 220 at the bottom of the first photolithography opening 233, the first planarization layer 230, the first bottom anti-reflective layer 231, and the first photoresist layer 232 may be removed.

Then, a process for implanting dopant ions into the first mask layer 220 disposed outside the second trench region is described below with reference to FIGS. 17-24.

Figure 17:
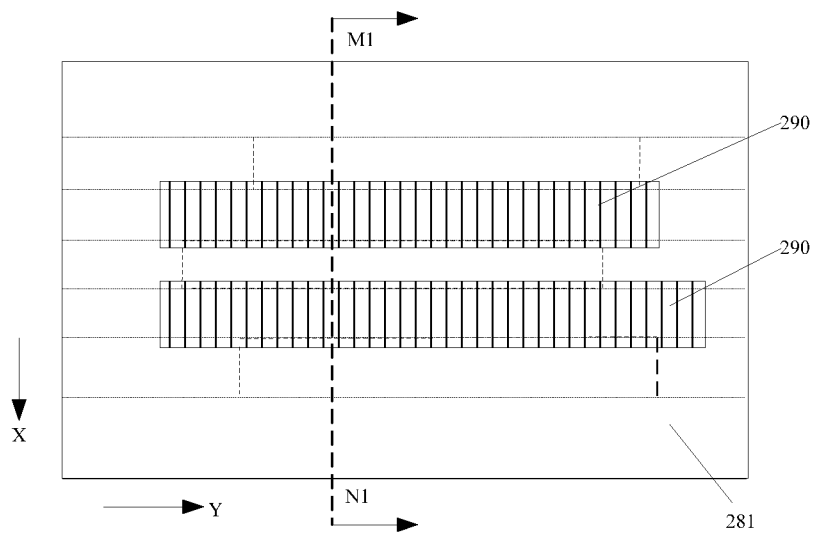
Figure 18:
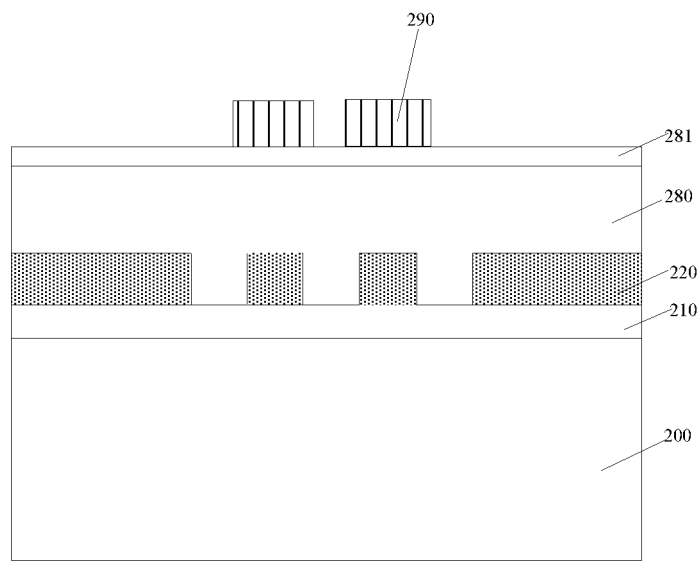

Returning to FIG. 42, after removing the first planarization layer, the first bottom anti-reflective layer and the first photoresist layer, a second photoresist layer may be formed (S107). FIGS. 17-18 illustrate a corresponding semiconductor structure. FIG. 17 illustrates a schematic diagram formed on the basis of FIG. 15, and FIG. 18 illustrates a cross-sectional view along a line 'M1-N1' in FIG. 17.

Referring to FIGS. 17-18, a second planarization layer 280 may be formed in and over the first trench 221, on the first mask layer 220 and on the divided doped layer 240. A second bottom anti-reflective layer 281 may be formed on the second planarization layer 280. A patterned second photoresist layer 290 may be formed on the second bottom anti-reflective layer 281. The second photoresist layer 290 may cover the second bottom anti-reflective layer 281 in the second trench region, and may expose the second bottom anti-reflective layer 281 in the first region A1 and the second bottom anti-reflective layer 281 in the second region A2 around the second trench region.

In one embodiment, the second photoresist layer 290 may be extended to a portion region of the first trench in the first direction X, such that the second photoresist layer 290 in the first direction X may have a substantially large size. Therefore, the second photoresist layer 290 may also cover a portion of the first mask layer on both sides of the first trench in the second direction Y. The first mask layer covered by the second photoresist layer 290 may be prevented from being implanted with dopant ions. The first mask layer not implanted with the dopant ions may be subsequently removed by etching to form a second trench. Thus, the second trench may be extended to the first mask layer 220 on both sides of the first trench in the second direction. In view of this, a portion region of the second trench may have an increased width in the first direction.

Figure 19:
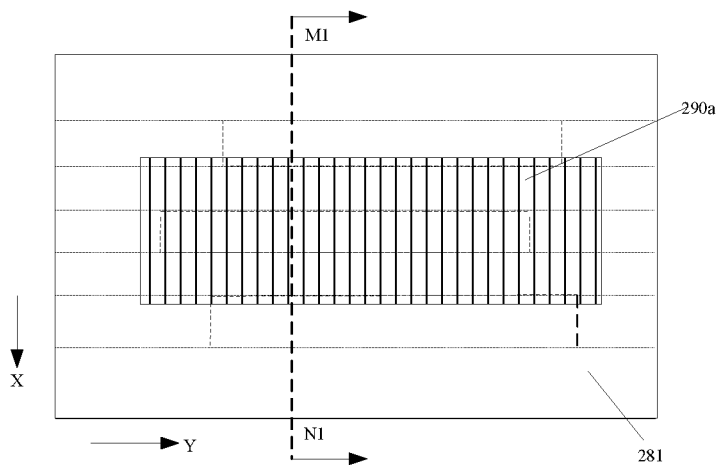

In another embodiment, referring to FIG. 19, the second photoresist layers 290a on adjacent second regions A2 may be connected together. In other words, the second photoresist layer 290a may be extended to the first trench 221 and to the first mask layer 220 on both sides of the first trench 221 in the second direction Y, such that the subsequently formed adjacent second trenches in the second region may be connected and may form an annular structure.

In a case where the second photoresist layer is extended to the first mask layer on both sides of the first trench in the second direction, and adjacent second trenches in the second region are connected and form an annular structure, a subsequently formed second conductive layer may further be extended to a corresponding layer to-be-etched on both sides of the first trench in the second direction. Therefore, a plug may be formed in a region where the width of the second conductive layer increases. The plug may have a substantially large contact area with the second conductive layer. In certain embodiments, the second photoresist layer may not be extended to the first trench in the first direction.

Figure 20:
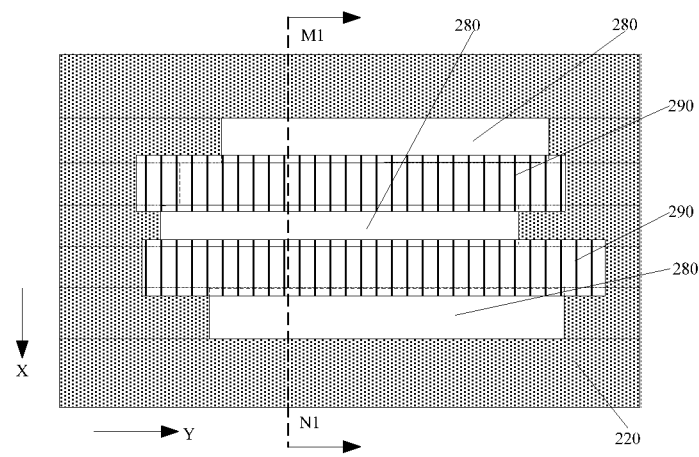
Figure 21:
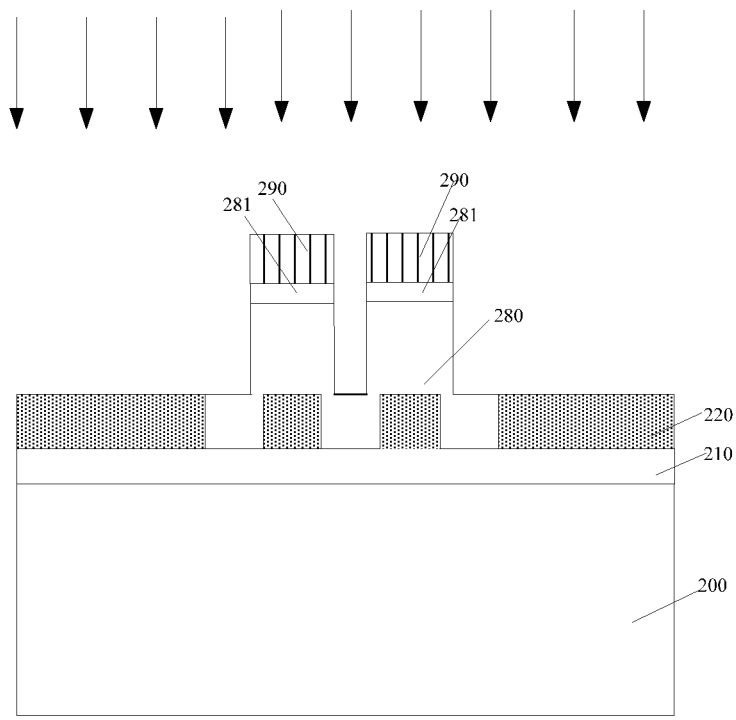

Returning to FIG. 42, after forming the second photoresist layer, dopant ions may be implanted into the first mask layer outside the second trench region (S108). FIGS. 20-21 illustrate a corresponding semiconductor structure. FIG. 20 illustrates a schematic diagram formed on the basis of FIG. 17, and FIG. 21 illustrates a schematic diagram formed on the basis of FIG. 18. FIG. 21 illustrates a cross-sectional view along a line 'M1-N1' in FIG. 20.

Referring to FIGS. 20-21, using the second photoresist layer 290 as a mask, the second bottom anti-reflective layer 281 and the second planarization layer 280 may be etched until the top surface of the first mask layer 220 is exposed. The second planarization layer 280 in the first trench 221 may be retained. After etching the second bottom anti-reflective layer 281 and the second planarization layer 280 by using the second photoresist layer 290 as a mask until the top surface of the first mask layer 220 is exposed, dopant ions may be implanted into the first mask layer 220 disposed outside the second trench region using the second photoresist layer 290 as a mask.

The dopant ions may include boron ions or arsenic ions. The first mask layer 220 disposed outside the second trench region may be implanted with the same dopant ions as the divided doped layer 240.

Because the second planarization layer 280 in the first trench 221 is retained, the second planarization layer 280 may block the dopant ions from being implanted into the material layer at the bottom of the first trench 221, and to prevent the etching performance of the material layer at the bottom of the first trench 221 from being affected. To avoid dopant ions from being implanted into the material layer at the bottom of the first trench, the second planarization layer 280 in the first trench may desire to be retained. Thus, the etching process may desire to be precisely controlled to avoid over-etching, which may cause the second planarization layer 280 in the first trench to be consumed substantially large.

Figure 22:
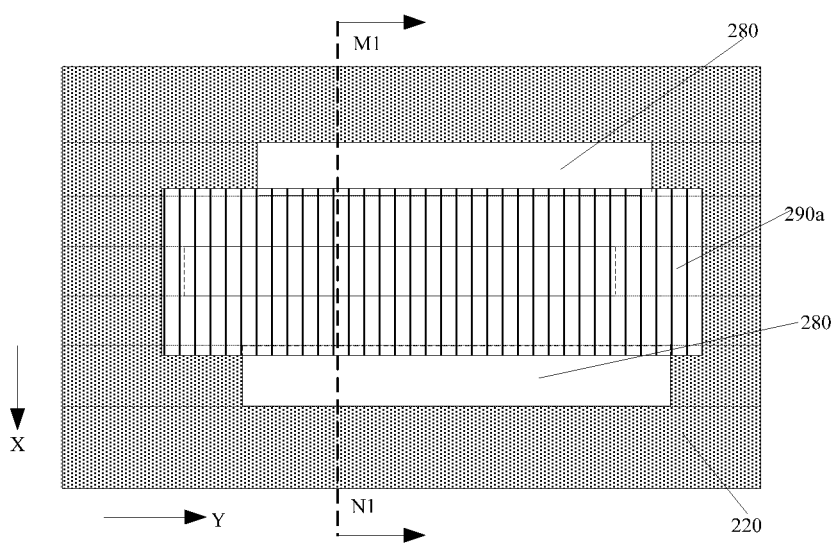

FIG. 22 illustrates a schematic diagram formed on the basis of FIG. 19. Referring to FIG. 22, using the second photoresist layer 290a as a mask, the second bottom anti-reflective layer 281 and the second planarization layer 280 may be etched until the top surface of the first mask layer 220 is exposed. The second planarization layer 280 in the first trench 221 may be retained. After etching the second bottom anti-reflective layer 281 and the second planarization layer 280 by using the second photoresist layer 290a as a mask until the top surface of the first mask layer 220 is exposed, dopant ions may be implanted into the first mask layer 220 disposed outside the second trench region using the second photoresist layer 290a as a mask.

Figure 23:
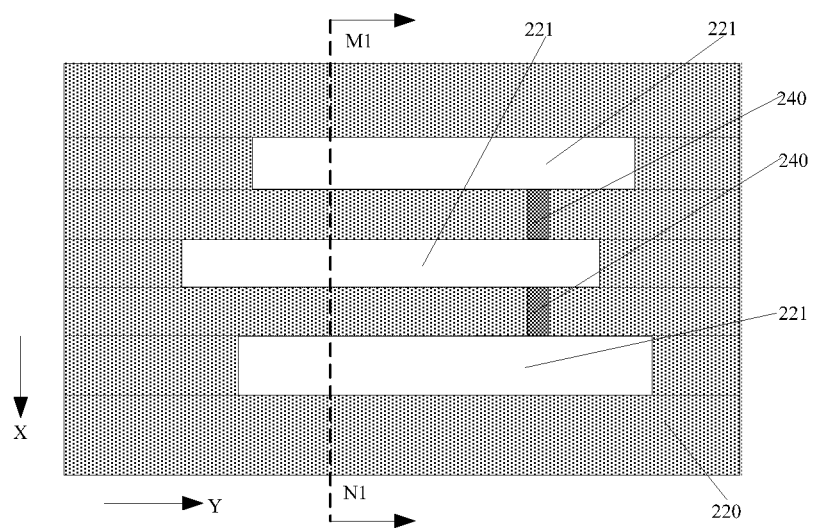
Figure 24:
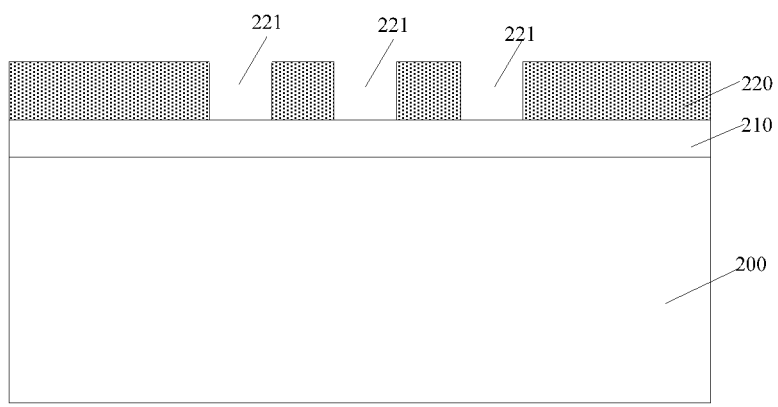

Returning to FIG. 42, after implanting the dopant ions into the first mask layer outside the second trench region, the second planarization layer, the second bottom anti-reflective layer and the second photoresist layer may be removed (S109). FIGS. 23-24 illustrate a corresponding semiconductor structure. FIG. 23 illustrates a schematic diagram formed on the basis of FIG. 20, and FIG. 24 illustrates a schematic diagram formed on the basis of FIG. 21. FIG. 24 illustrates a cross-sectional view along a line 'M1-N1' in FIG. 23.

Referring to FIGS. 23-24, after implanting the dopant ions into the first mask layer 220 disposed outside the second trench region using the second photoresist layer 290 as a mask, the second planarization layer 280, the second bottom anti-reflective layer 281 and the second photoresist layer 290 may be removed.

In one embodiment, after forming the first trench 221, the divided doped layer 240 may be formed. Therefore, the position of the divided doped layer 240 may be precisely disposed between the adjacent first trenches 221, and the sidewalls of the divided doped layer 240 in the first direction X may have a morphology substantially consistent with the first mask layer 220 exposed by the sidewalls of the first trench 221 in the first direction X. Thus, the subsequently formed first conductive layer may have a substantially uniform width in the first direction X.

In one embodiment, after forming the first trench 221, dopant ions may be implanted into the first mask layer 220 disposed outside the second trench region. This is different than implanting the dopant ions in the first mask layer before forming the first trench. When implanting the dopant ions in the first mask layer before forming the first trench, dopant ions may be implanted into the first mask layer 220 corresponding to the position of the first trench 221, which may increase difficulties in etching the first mask layer 220 to form the first trench 221. Therefore, implanting the dopant ions in the first mask layer 220 after forming the first trench 221 may reduce process difficulties.

In one embodiment, after forming the divided doped layer 240, dopant ions may be implanted into the first mask layer 220 disposed outside the second trench region. In certain embodiments, after implanting dopant ions into the first mask layer 220 disposed outside the second trench region, the divided doped layer 240 may be formed.

The first trench may often be formed by etching the first mask layer using a dry etching process. When the first trench is formed after forming the divided doped layer, during the dry etching process for forming the first trench, the first mask layer implanted with the dopant ions may have a similar etching rate as the first mask layer not implanted with the dopant ions. The dopant ions may slightly change the etching performance of the first mask layer in the dry etching process.

In one embodiment, after forming the divided doped layer and after implanting dopant ions into the first mask layer outside the second trench region, the first trench may be formed. In another embodiment, after implanting dopant ions into the first mask layer outside the second trench region, the first trench may be formed, and the divided doped layer may be formed after forming the first trench. In certain embodiments, after forming the divided doped layer, the first trench may be formed, and dopant ions may be implanted into the first mask layer outside the second trench region after forming the first trench.

After forming the divided doped layer and after implanting dopant ions into the first mask layer outside the second trench region, a mask sidewall spacer may be formed on the sidewall of the first trench. After forming the divided doped layer and after implanting dopant ions into the first mask layer outside the second trench region, a divided filling layer may be formed in the first trench, and the divided filling layer may divide the first trench in the second direction.

In one embodiment, the divided filling layer may be formed in the process of forming the mask sidewall spacer. In another embodiment, the divided filling layer may be formed after forming the mask sidewall spacer. In certain embodiments, the mask sidewall spacer may be formed after forming the divided filling layer.

Methods for forming the divided filling layer and the mask sidewall spacer are described below with reference to FIGS. 25-34.

Figure 25:
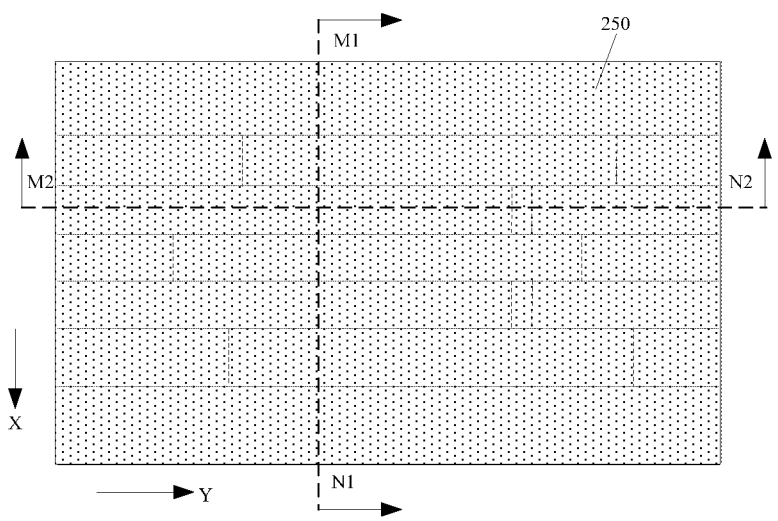
Figure 26:
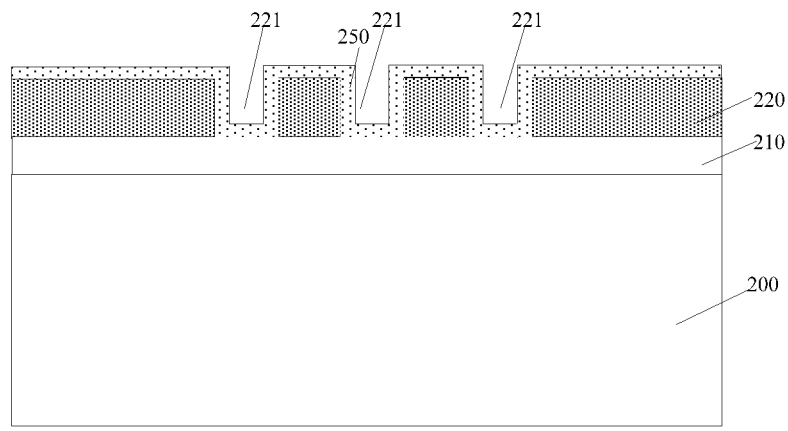
Figure 27:
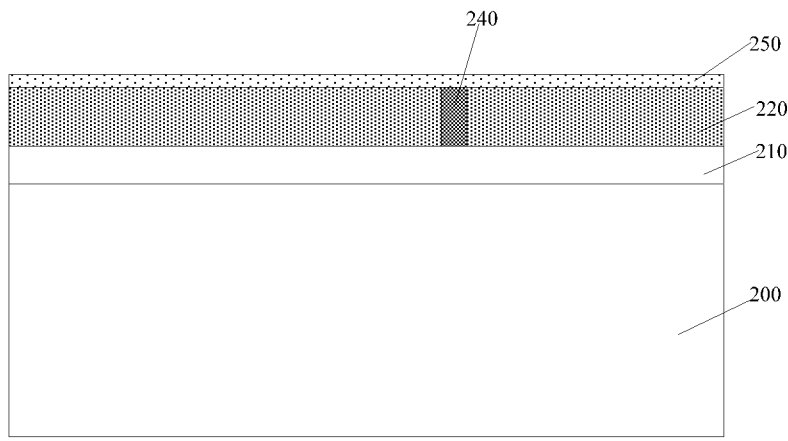

Returning to FIG. 42, after removing the second planarization layer, the second bottom anti-reflective layer and the second photoresist layer, a sidewall spacer film may be formed (S110). FIGS. 25-27 illustrate a corresponding semiconductor structure. FIG. 25 illustrates a schematic diagram formed on the basis of FIG. 23, and FIG. 26 illustrates a schematic diagram formed on the basis of FIG. 24. FIG. 26 illustrates a cross-sectional view along a line 'M1-N1' in FIG. 25, and FIG. 27 illustrates a cross-sectional view along a line 'M2-N2' in FIG. 25.

Referring to FIGS. 25-27, a sidewall spacer film 250 may be formed on the sidewall and at bottom of the first trench 221, on the top surface of the first mask layer 220, and on the surface of the divided doped layer 240. The sidewall spacer film 250 may be made of a material including $SiO_2$, SiN, $TiO_2$, TiN, AlN or $Al_2O_3$. The process for forming the sidewall spacer film 250 may be a deposition process, e.g., an atomic layer deposition process. The sidewall spacer film 250 may have a thickness in a range of approximately 10 nm-30 nm, e.g., 10 nm, 15 nm, 20 nm or 30 nm.

Figure 28:
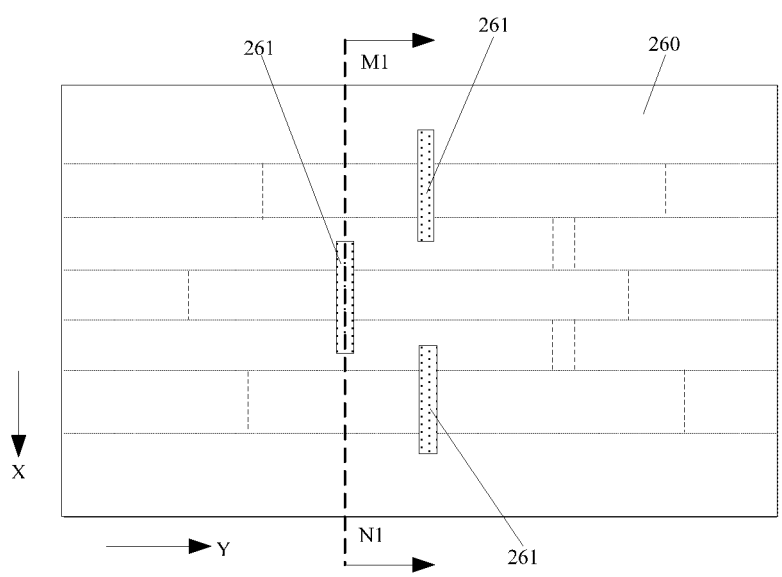
Figure 29:
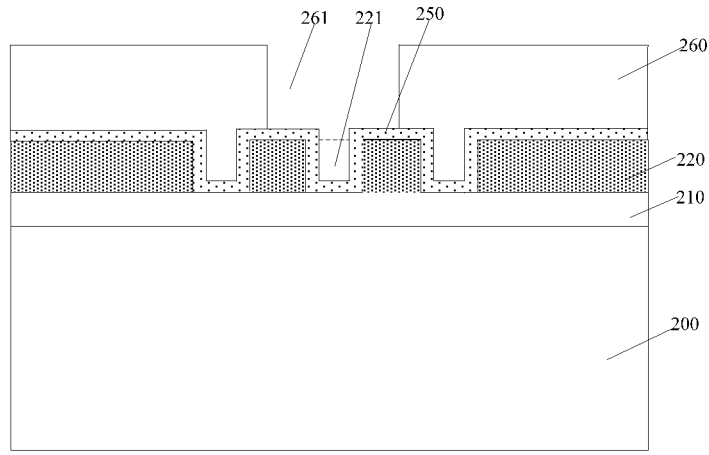

Returning to FIG. 42, after forming the sidewall spacer film, a barrier layer may be formed (S111). FIGS. 28-29 illustrate a corresponding semiconductor structure. FIG. 28 illustrates a schematic diagram formed on the basis of FIG. 25, and FIG. 29 illustrates a schematic diagram formed on the basis of FIG. 26. FIG. 29 illustrates a cross-sectional view along a line 'M1-N1' in FIG. 28.

Referring to FIGS. 28-29, after forming the sidewall spacer film 250, a barrier layer 260 may be formed over the first mask layer 220 and in one or more the first trenches 221. The barrier layer 260 may have a barrier opening 261 exposing the first trench 221 in the first direction X and a portion of the first trench 221 in the second direction Y. The barrier opening 261 may be connected to the exposed first trench 221. The barrier opening 261 may also be extended to the second region A2 in the first direction X, and the barrier layer 260 may be formed on the sidewall spacer film 250.

The barrier layer 260 may be made of a material including a carbon-containing organic polymer. An extension direction of the barrier opening 261 may be parallel to the first direction X.

The method for forming the barrier layer 260 may include forming a third planarization film over the first mask layer 220 and in the first trench 221; forming a third bottom anti-reflective layer on the third planarization film; and forming a patterned third photoresist layer on the third bottom anti-reflective layer. The third photoresist layer may have a third photolithography opening, and the third photolithography opening may be disposed over the first trench 221 in the first direction X and a portion of the first trench 221 in the second direction Y and extended to the second region in the first direction. The method may also include using the third photolithography opening as a mask, removing the third bottom anti-reflective layer and the third planarization film at the bottom of the third photolithography opening by etching to form the barrier layer 260 from the third planarization film. Further, after removing the third bottom anti-reflective layer and the third planarization film at the bottom of the third photolithography opening by etching, the method may include removing the third photoresist layer and the third bottom anti-reflective layer. The third photolithography opening may define a position of the barrier opening 261.

An overlapped region between the barrier opening 261 and the first trench 221 may be used to define a position of the divided filling layer. A width of the barrier opening 261 in the second direction Y may be used to define the size of the divided filling layer in the second direction. Because the size of the divided filling layer in the second direction desires to be substantially small, the width of the barrier opening 261 in the second direction may be substantially small. In one embodiment, the width of the barrier opening 261 in the second direction may be in a range of approximately 10 nm-40 nm, e.g., 20 nm, 30 nm, or 40 nm.

The barrier opening 261 may be extended to the second region A2 in the first direction X, such that the size of the barrier opening 261 in the first direction may be made substantially large. Thus, the size of the barrier opening 261 in the second direction may desire to be defined substantially small, and the size thereof in the first direction may not desire to be defined substantially small.

Because the third photolithography opening defines a position of the barrier opening 261, the size of the third photolithography opening in the first direction may correspond to the size of the barrier opening 261 in the first direction, and the size of the third photolithography opening in the second direction may correspond to the size of the barrier opening 261 in the second direction. Therefore, the size of the third photolithography opening in the second direction may desire to be defined substantially small, and the size of the third photolithography opening in the first direction may not desire to be defined substantially small, which may reduce the challenge of the photolithography process and reduce the process difficulty.

In one embodiment, the third photolithography opening may have a width in the second direction in a range of approximately 10 nm-40 nm, and the third photolithography opening may have a size in the first direction X in a range of approximately 65 nm-1000 nm, e.g., 80 nm, 100 nm, or 200 nm.

Figure 30:
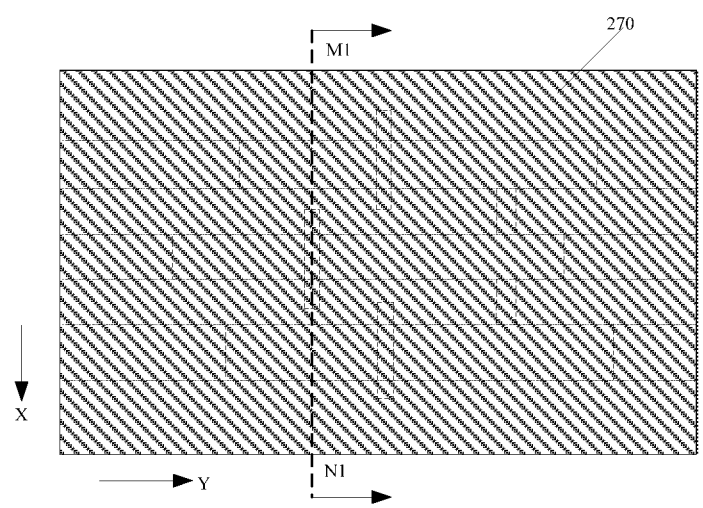
Figure 31:
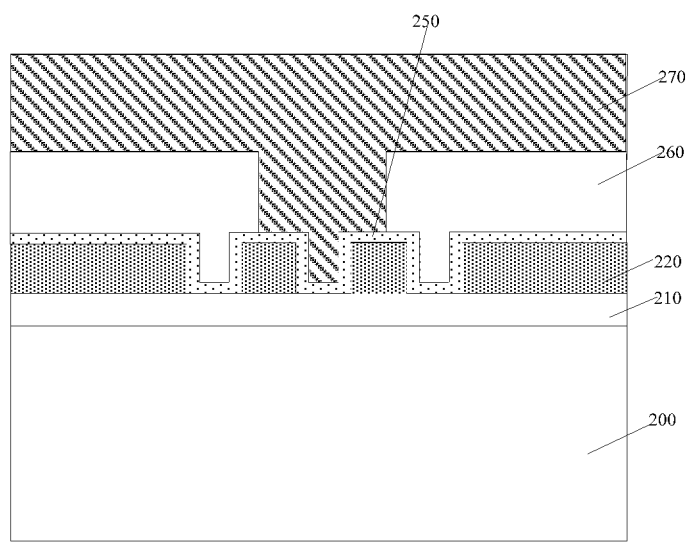

Returning to FIG. 42, after forming the barrier layer, a divided filling film may be formed (S112). FIGS. 30-31 illustrate a corresponding semiconductor structure. FIG. 30 illustrates a schematic diagram formed on the basis of FIG. 28, and FIG. 31 illustrates a schematic diagram formed on the basis of FIG. 29. FIG. 31 illustrates a cross-sectional view along a line 'M1-N1' in FIG. 30.

Referring to FIGS. 30-31, after forming the barrier layer 260, a divided filling film 270 may be formed in the barrier opening 261, in the first trench 221 exposed by the barrier opening 261, and on the barrier layer 260. The divided filling film 270 may also be formed on the sidewall spacer film 250. The divided filling film 270 may be made of a material including $SiO_2$, SiN, $TiO_2$, TiN, AlN or $Al_2O_3$. A process for forming the divided filling film 270 may include a deposition process. An entire surface of the divided filling film 270 may be above a top surface of the barrier layer 260.

In one embodiment, the divided filling layer may be formed in a process of forming a mask sidewall spacer. The divided filling layer may be made of a material different from the mask sidewall spacer, and correspondingly, the divided filling film 270 may be made of a material different from the sidewall spacer film 250.

Figure 32:
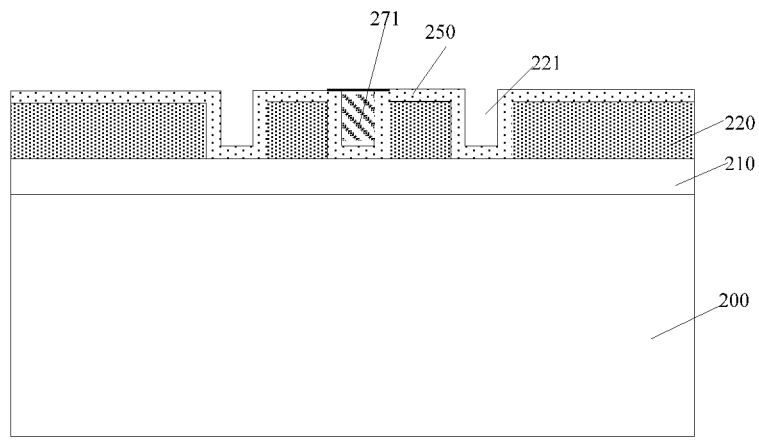

Returning to FIG. 42, after forming divided filling film, a divided filling layer may be formed (S113). FIG. 32 illustrates a corresponding semiconductor structure. FIG. 32 illustrates a schematic diagram formed on the basis of FIG. 31.

Referring to FIG. 32, the divided filling film 270 and the barrier layer 260 may be back-etched until the surface of the sidewall spacer film 250 disposed on the top surface of the first mask layer 220 is exposed to form a divided filling layer 271. Further, the process of back-etching the divided filling film 270 and the barrier layer 260 may remove the barrier layer 260 in the first trench 221. The divided filling layer 271 may divide the first trench 221 in the second direction Y.

Figure 33:
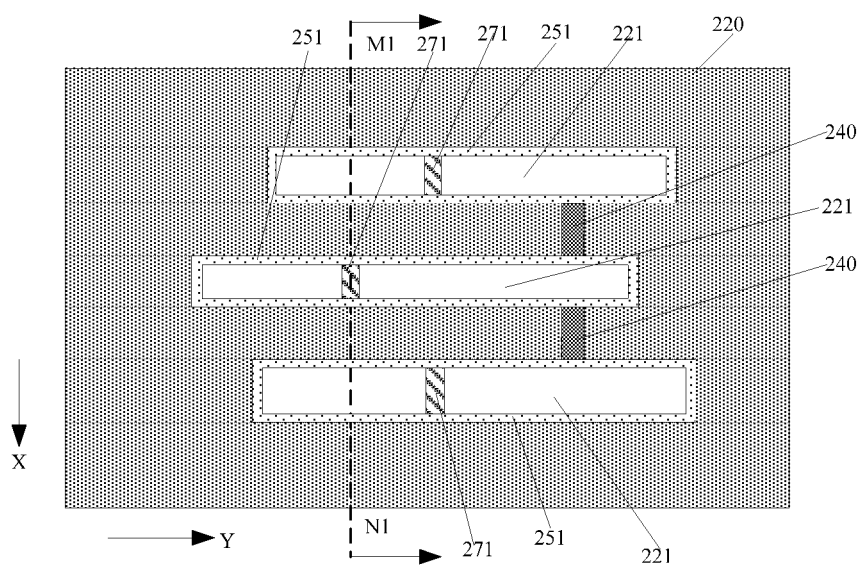
Figure 34:
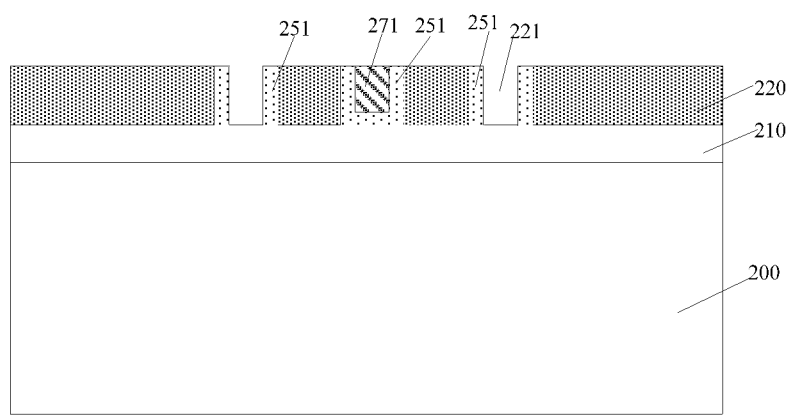

Returning to FIG. 42, after forming the divided filling film, a mask sidewall spacer may be formed (S114). FIGS. 33-34 illustrate a corresponding semiconductor structure. FIG. 34 illustrates a cross-sectional view along a line 'M1-N1' in FIG. 33.

Referring to FIGS. 33-34, after forming the divided filling layer 271, the sidewall spacer film 250 may be back-etched until the top surface of the first mask layer 220 is exposed to form the mask sidewall spacer 251. The mask sidewall spacer 251 may be formed on a sidewall of the first trench 221. The mask sidewall spacer 251 may have a thickness in a range of approximately 10 nm-30 nm, e.g., 10 nm, 15 nm, 20 nm or 30 nm.

In one embodiment, the mask sidewall spacer 251 may be disposed on both sidewalls of the divided filling layer 271 in the first direction X, and the mask sidewall spacer 251 may not be disposed on both sidewalls of the divided filling layer 271 in the second direction Y. Therefore, the first trench 221 may be merely divided by the divided filling layer 271 in the second direction Y. A spacing between the first trenches 221 on both sides of the divided filling layer 271 in the second direction may be the size of the divided filling layer 271 in the second direction. The spacing between the first trenches 221 on both sides of the divided filling layer 271 in the second direction Y may be substantially small.

In one embodiment, because the divided filling layer 271 is formed in the process of forming the mask sidewall spacer 251, a bottom of the divided filling layer 271 may include the material of the mask sidewall spacer 251. In one embodiment, the divided filling layer 271 may be made of a material including $SiO_2$, SiN, $TiO_2$, TiN, AlN or $Al_2O_3$. The mask sidewall spacer 251 may be made of a material including $SiO_2$, SiN, $TiO_2$, TiN, AlN or $Al_2O_3$. In one embodiment, the mask sidewall spacer 251 may be made of a material different from the divided filling layer 271.

Because an overlapped region between the barrier opening 261 and the first trench 221 defines a position of the divided filling layer 271, the divided filling layer 271 may have a substantially small size in the first direction X. Because the width of the barrier opening 261 in the second direction is used to define the size of the divided filling layer 271 in the second direction Y, when the width of the barrier opening 261 in the second direction Y is substantially small, the size of the divided filling layer 271 in the second direction Y may be substantially small.

In one embodiment, the divided filling layer 271 may not be extended to the second region A2, and, thus, the divided filling layer 271 may not affect the position at which the second trench is cut. In one embodiment, the size of the divided filling layer 271 in the first direction X may be in a range of approximately 10 nm-60 nm, and the size of the divided filling layer 271 in the second direction Y may be in a range of approximately 10 nm-40 nm.

In one embodiment, the divided filling layer 271 may be formed in the process of forming the mask sidewall spacer 251. When back-etching the divided filling film 270 and the barrier layer 260, the back-etching process may be stopped at the surface of the sidewall spacer film 250 disposed on the top surface of the first mask layer 220. Therefore, the top surface of the first mask layer 220 may not be exposed when back-etching the divided filling film 270 and the barrier layer 260, such that the etching damage to the top surface of the first mask layer 220 may be substantially small. The process of back-etching the divided filling film 270 and the barrier layer 260 may tend to be stopped at the sidewall spacer film 250. When the first mask layer 220 is made of amorphous silicon, the chemical bond in the amorphous silicon may be substantially weak, and the process of back-etching the divided filling film 270 and the barrier layer 260 may not be easily stopped at the first mask layer 220. Therefore, the end point of back-etching the divided filling film 270 and the barrier layer 260 may be precisely controlled. The mask sidewall spacer 251 may not be disposed on both sidewalls of the divided filling layer 271 in the second direction, such that the first trench 221 may be merely divided by the divided filling layer 271 in the second direction, and the spacing between the first trenches 221 on both sides of the divided filling layer 271 in the second direction may be substantially small.

In another embodiment, the divided filling layer may be formed after forming the mask sidewall spacer. In view of this, the mask sidewall spacer may be formed on the sidewall of the first trench, and the bottom of the divided filling layer may not include the material of the mask sidewall spacer. The mask sidewall spacer may not be disposed on both sidewall surfaces of the divided filling layer in the second direction. The divided filling layer may be made of a same material as or a material different from the mask sidewall spacer.

In certain embodiments, after forming the divided filling layer, the mask sidewall spacer may be formed. In view of this, the mask sidewall spacer may be formed on the sidewall of the first trench. The mask sidewall spacer may be disposed on both sidewall surfaces of the divided filling layer in the second direction, and may not be disposed on both sidewall surfaces of the divided filling layer in the first direction. The divided filling layer may also divide the mask sidewall spacer in the second direction, and the bottom of the divided filling layer may not include the material of the mask sidewall spacer. The divided filling layer may be made of a same material as or a material different from the mask sidewall spacer.

Figure 35:
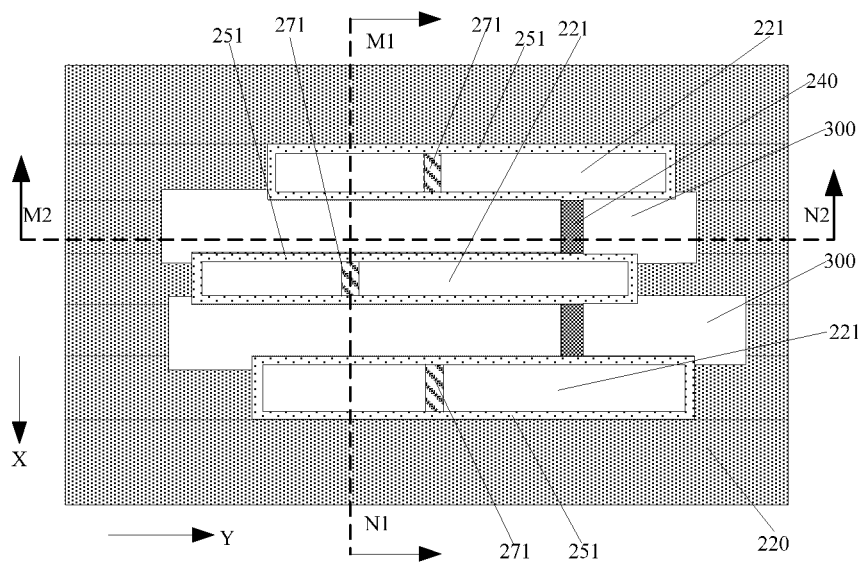
Figure 36:
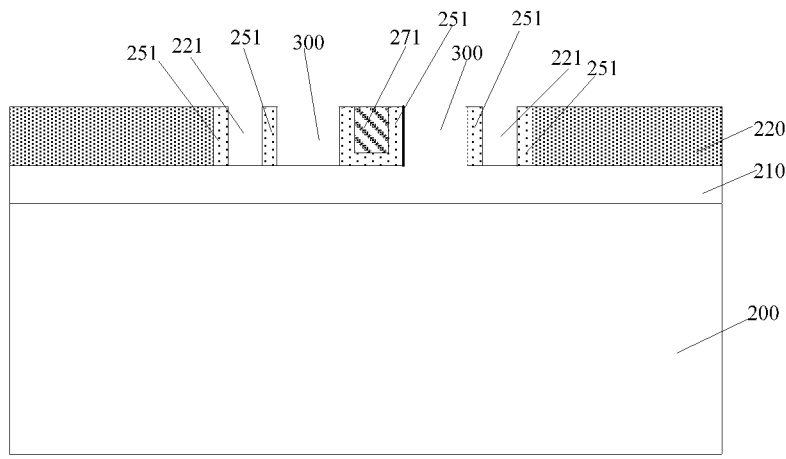
Figure 37:
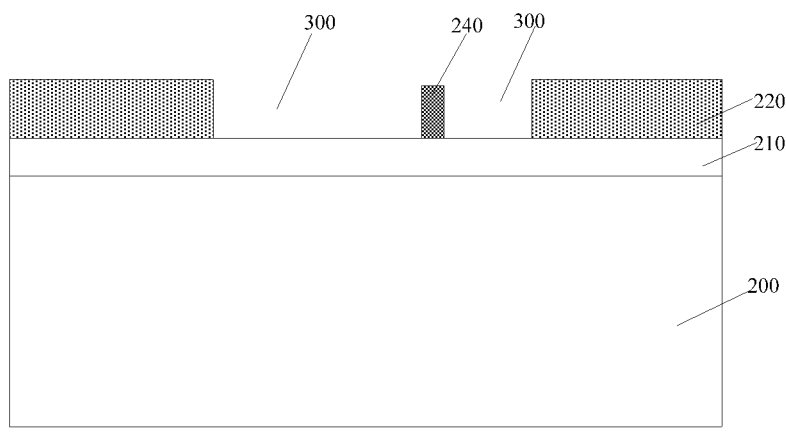

Returning to FIG. 42, after forming the divided filling layer and the mask sidewall spacer, a discrete second trench may be formed (S115). FIGS. 35-37 illustrate a corresponding semiconductor structure. FIG. 35 illustrates a schematic diagram formed on the basis of FIG. 33, and FIG. 36 illustrates a schematic diagram formed on the basis of FIG. 34. FIG. 36 illustrates a cross-sectional view along a line 'M1-N1' in FIG. 35, and FIG. 37 illustrates a cross-sectional view along a line 'M2-N2' in FIG. 35.

Referring to FIGS. 35-37, after forming the divided filling layer 271 and the mask sidewall spacer 251, the first mask layer 220 in the second trench region on both sides of the divided doped layer 240 may be removed by etching to form a discrete second trench 300 in the first mask layer 220 in the second region A2. The second trench 300 may be disposed on both sides of the divided doped layer 240 in the second direction Y, and the sidewall of the second trench 300 may expose the mask sidewall spacer 251.

In one embodiment, the process for removing the first mask layer 220 in the second trench region on both sides of the divided doped layer 240 may include a wet etching process. In one embodiment, the dopant ions may be implanted into the first mask layer 220, and the dopant ions may effectively affect the etching performance of the first mask layer 220 in the wet etching process. The wet etching process may be capable of removing the first mask layer 220 in the second trench region on both sides of the divided doped layer 240.

In the process of removing the first mask layer 220 in the second trench region on both sides of the divided doped layer 240 by etching, the first mask layer 220 not implanted with the dopant ions may have an etching rate greater than the first mask layer 220 implanted with the dopant ions. In one embodiment, in the process of removing the first mask layer 220 in the second trench region on both sides of the divided doped layer 240, a ratio of the etching rate of the first mask layer 220 not implanted with dopant ions over the etching rate of the first mask layer 220 implanted with dopant ions may be greater than 100, e.g., 150.

Because the dopant ions implanted into the first mask layer 220 disposed outside the second trench region are the same as the dopant ions in the divided doped layer 240, when removing the first mask layer 220 in the second trench region on both sides of the divided doped layer 240 by etching, the divided doped layer 240 may not be removed by etching.

An extension direction of the second trench 300 may be parallel to the second direction Y. The second trench 300 may have a width in the first direction X in a range of approximately 10 nm-60 nm. The divided doped layer 240 may divide the second trench 300 in the second direction Y. The sidewall of the second trench 300 may expose the mask sidewall spacer 251. The first trench 221 and the second trench 300 may be separated by the mask sidewall spacer 251.

Figure 38:
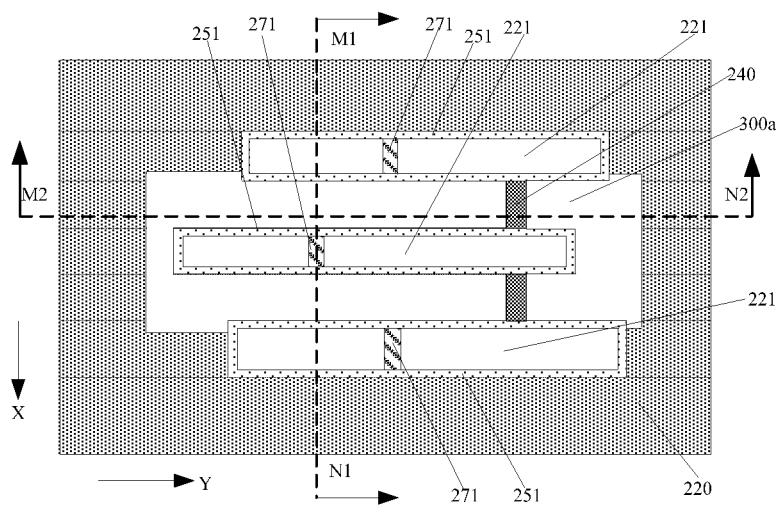

FIG. 38 illustrates a schematic diagram formed on the basis of FIG. 22. Referring to FIG. 38, the first mask layer 220 in the second trench region on both sides of the divided doped layer 240 may be removed by etching to form discrete second trench 300a in the first mask layer 220 in the second region A2. The second trench 300a may be disposed on both sides of the divided doped layer 240 in the second direction Y, and the sidewall of the second trench 300a may expose the mask sidewall spacer 251.

Referring to FIG. 38, the second trench 300a in adjacent second regions may be interconnected. The second trench 300a in adjacent second regions may form an annular structure, and the second trench 300a may surround the first trench 221.

In one embodiment, the method may further include: etching the layer 200 to-be-etched at the bottom of the first trench 221 to form a first target trench in the first region of the layer 200 to-be-etched; and etching the layer 200 to-be-etched at the bottom of the second trench 300 to form a second target trench in the second region of the layer to-be-etched. Moreover, the method may include forming a first conductive layer in the first target trench, and forming a second conductive layer in the second target trench.

In one embodiment, the method may further include before etching the layer to-be-etched at the bottom of the first trench and the layer to-be-etched at the bottom of the second trench, etching the second adhesive layer, the bottom hard mask layer and the first adhesive layer at the bottom of the first trench to form a first hard mask trench in the bottom hard mask layer. In addition, the method may include etching the second adhesive layer, the bottom hard mask layer and the first adhesive layer at the bottom of the second trench, to form a second hard mask trench in the bottom hard mask layer at the bottom of the second trench.

In one embodiment, after etching the second adhesive layer, the bottom hard mask layer and the first adhesive layer at the bottom of the first trench and etching the second adhesive layer, the bottom hard mask layer and the first adhesive layer at the bottom of the second trench, and before forming the first conductive layer and the second conductive layer, the first mask layer and the second adhesive layer may be removed. After removing the first mask layer and the second adhesive layer, the layer to-be-etched at the bottom of the first trench may be etched to form the first target trench in the layer to-be-etched. The layer to-be-etched at the bottom of the second trench may be etched to form the second target trench in the layer to-be-etched. After forming the first target trench and the second target trench, a conductive film may be formed in the first target trench and the second target trench, and on the bottom hard mask layer. The conductive film may be planarized until a top surface of the bottom hard mask layer is exposed to form the first conductive layer in the first target trench and to form the second conductive layer in the second target trench. Then, the bottom hard mask layer and the first adhesive layer may be removed. The first conductive layer and the second conductive layer may be made of a metal, e.g., copper or aluminum.

The present disclosure also provides a semiconductor device formed by the above-disclosed methods.

The present disclosure further provides another method for forming a semiconductor device. The same or similar features of the embodiments in the present disclosure and the embodiments associated with FIGS. 6-38 are not repeated herein, while certain difference may include the following. In the embodiments of the present disclosure, after forming the divided doped layer, the first trench may be formed after implanting dopant ions into the first mask layer outside the second trench region.

For illustrative purposes, dopant ions may be implanted into the first mask layer outside the second trench region after forming the divided doped layer as an example. In certain embodiments, the divided doped layer may be formed after implanting dopant ions into the first mask layer outside the second trench region.

Figure 39:
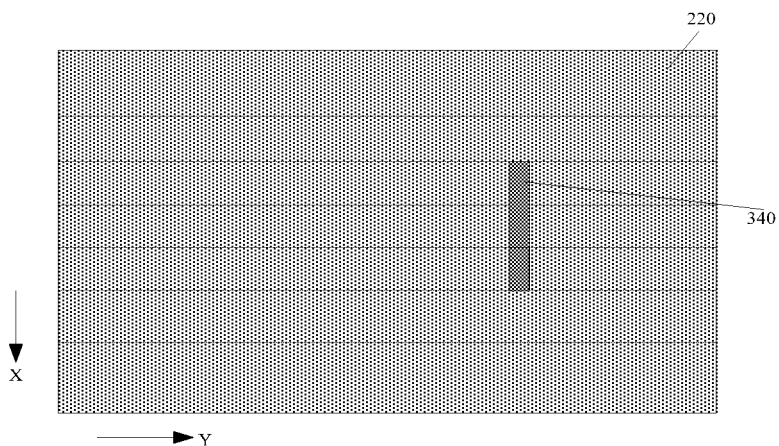
FIGS. 39-41 illustrate semiconductor structures corresponding to certain stages for forming another exemplary semiconductor device consistent with various disclosed embodiments of the present disclosure.
Figure 40:
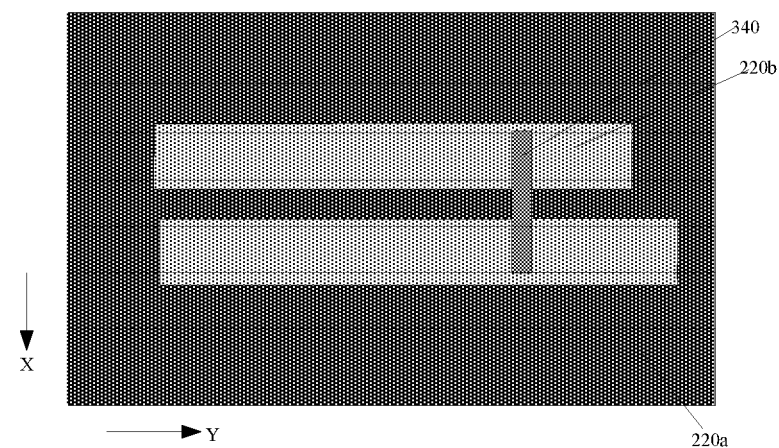
Figure 41:
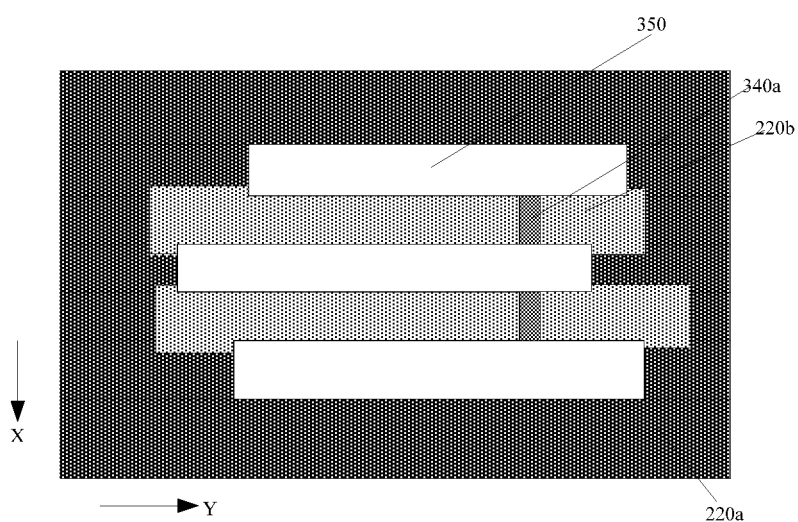
Figure 43:
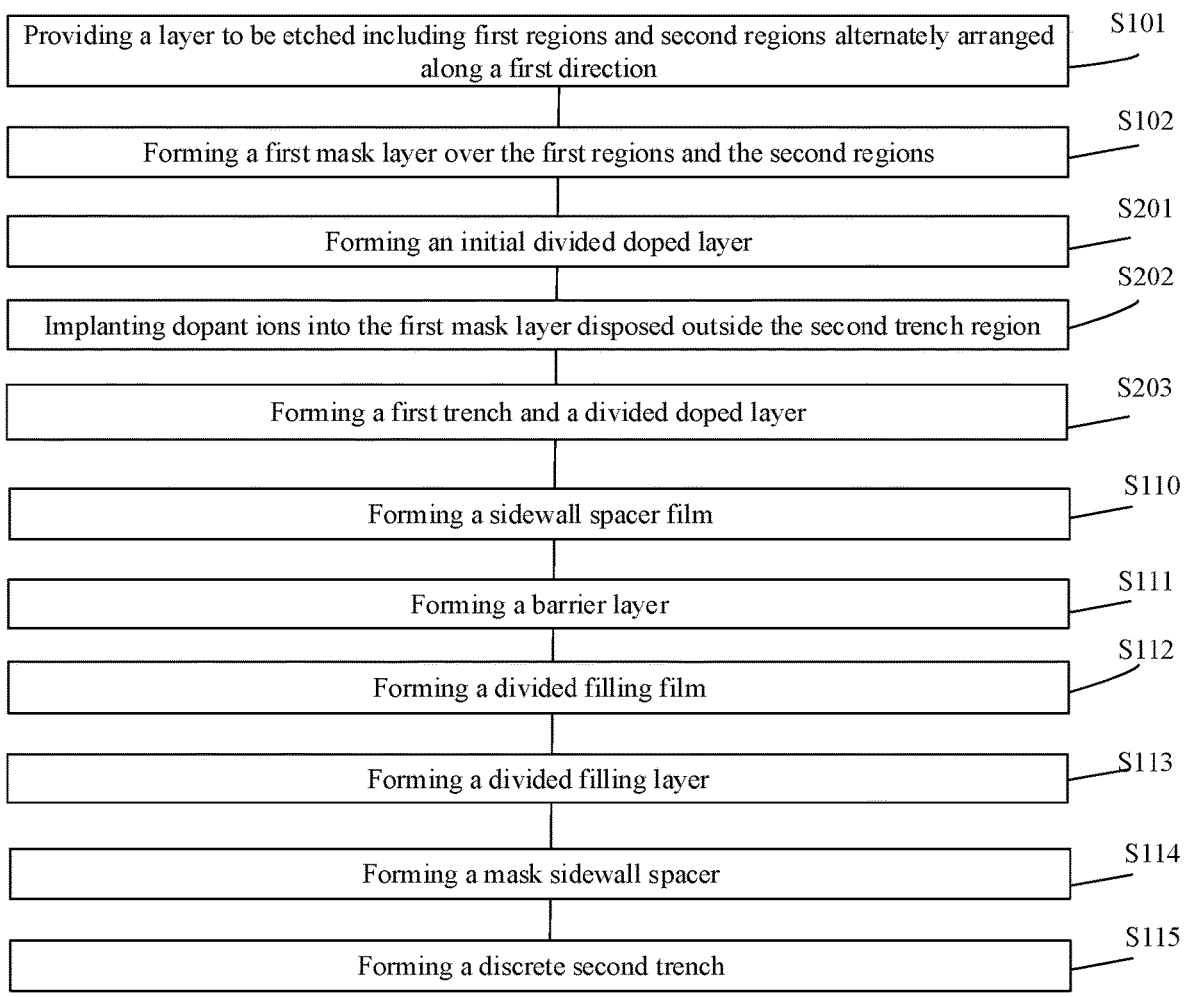
FIG. 43 illustrates another exemplary method for forming a semiconductor device consistent with various disclosed embodiments of the present disclosure.

FIG. 43 illustrates another exemplary method for forming a semiconductor device consistent with various disclosed embodiments of the present disclosure; and FIGS. 39-41 illustrate semiconductor structures corresponding to certain stages of the exemplary fabrication method.

As shown in FIG. 43, after forming the first mask layer associated with FIG. 7, an initial divided doped layer may be formed (S201). FIG. 39 illustrates a corresponding semiconductor structure. FIG. 39 illustrates a schematic diagram formed on the basis of FIG. 7.

Referring to FIG. 39, an initial divided doped layer 340 may be formed in the first mask layer 220 in the second region A2. The initial divided doped layer 340 may divide the first mask layer 220 in the second trench region, and the initial divided doped layer 340 may be extended to the first mask layer 220 in the first region A1. An extension direction of the initial divided doped layer 340 may be parallel to the first direction X.

In one embodiment, the method for forming the initial divided doped layer 340 may include the following. A first planarization layer may be formed on the first mask layer 220. A first bottom anti-reflective layer may be formed on the first planarization layer. A patterned first photoresist layer may be formed on the first bottom anti-reflective layer, where the first photoresist layer contains a first photolithography opening. The first photolithography opening may be disposed on a portion region of the second trench region, and may also be extended to the first region.

Using the first photoresist layer as a mask, the first bottom anti-reflective layer and the first planarization layer at the bottom of the first photolithography opening may be etched until a top surface of the first mask layer 220 is exposed. Then, using the first photoresist layer as a mask, dopant ions may be implanted into the first mask layer 220 at the bottom of the first photolithography opening to form the initial divided doped layer 340. After implanting dopant ions into the first mask layer at the bottom of the first photolithography opening, the first planarization layer, the first bottom anti-reflective layer and the first photoresist layer may be removed.

An extension direction of the first photolithography opening may be parallel to the first direction X. A width of the first photolithography opening in the second direction Y may be used to define the size of the initial divided doped layer in the second direction Y. Because the size of the initial divided doped layer in the second direction Y is substantially small, the width of the first photolithography opening in the second direction Y may be substantially small. In one embodiment, the width of the first photolithography opening in the second direction Y may be in a range of approximately 20 nm-60 nm, e.g., 20 nm, 30 nm, 40 nm, 50 nm, or 60 nm.

The first photolithography opening may be extended to the first region, such that the size of the first photolithography opening in the first direction X may be made substantially large. Thus, the size of the first photolithography opening in the second direction Y may desire to be defined substantially small, and the size thereof in the first direction X may not desire to be defined substantially small. Therefore, the challenge on the photolithography process may be reduced, and the process difficulty may decrease. In one embodiment, the size of the first photolithography opening in the first direction X may be in a range of approximately 65 nm-1000 nm, e.g., 80 nm, 100 nm, or 200 nm.

In one embodiment, the position of the first photolithography opening may define the position of the initial divided doped layer 340, such that the size of the initial divided doped layer 340 in the second direction Y may be substantially small, and the size of the initial divided doped layer 340 in the first direction may be substantially large. In one embodiment, the initial divided doped layer 340 may have a size in the first direction X in a range of approximately 65 nm-1000 nm, e.g., 80 nm, 100 nm, or 200 nm. The initial divided doped layer 340 may have a width in the second direction Y in a range of approximately 20 nm-60 nm, e.g., 20 nm, 30 nm, 40 nm, 50 nm or 60 nm.

Returning to FIG. 43, after forming the initial divided doped layer, dopant ions may be implanted into the first mask layer outside the second trench region (S202). FIG. 40 illustrates a corresponding semiconductor structure. FIG. 40 illustrates a schematic diagram formed on the basis of FIG. 39.

Referring to FIG. 40, dopant ions may be implanted into the first mask layer 220 disposed outside the second trench region. Implanting the dopant ions into the first mask layer 220 disposed outside the second trench region may include the following. A second planarization layer may be formed on the first mask layer and the initial divided doped layer 340. A second bottom anti-reflective layer may be formed on the second planarization layer. A patterned second photoresist layer may be formed on the second bottom anti-reflective layer. The second photoresist layer may cover the second bottom anti-reflective layer in the second trench region, and may expose the second bottom anti-reflective layer in the first region and the second bottom anti-reflective layer in the second region around the second trench region.

Using the second photoresist layer as a mask, the second bottom anti-reflective layer and the second planarization layer may be etched until the top surface of the first mask layer is exposed. After etching the second bottom anti-reflective layer and the second planarization layer by using the second photoresist layer as a mask until the top surface of the first mask layer is exposed, dopant ions may be implanted into the first mask layer outside the second trench region using the second photoresist layer as a mask. After implanting the dopant ions into the first mask layer disposed outside the second trench region using the second photoresist layer as a mask, the second planarization layer, the second bottom anti-reflective layer and the second photoresist layer may be removed.

Dopant ions may be implanted into the first mask layer 220 disposed outside the second trench region, such that the first mask layer 220 may be divided into an ions doped region 220a and a non-doped region 220b. The non-doped region 220b may define a position of the second trench. In one embodiment, the second photoresist layer may also cover a portion of the first mask layer in the first region. In certain embodiments, the second photoresist layer may not cover the first mask layer in the first region.

Returning to FIG. 43, after implanting dopant ions into the first mask layer disposed outside the second trench region, a first trench and a divided doped layer may be formed (S203). FIG. 41 illustrates a corresponding semiconductor structure. FIG. 41 illustrates a schematic diagram formed on the basis of FIG. 40.

Referring to FIG. 41, after forming the initial divided doped layer 340, and after implanting dopant ions into the first mask layer 220 disposed outside the second trench region, the first mask layer 220 corresponding to the position of the first trench, the initial divided doped layer 340 in the first region, a portion of doped first mask layer 220a and a portion of non-doped layer 202b may be removed by etching to form a first trench 350 in the first mask layer 220 in the first region, and to form the divided doped layer 340a from the initial divided doped layer 340.

After forming the divided doped layer and implanting dopant ions into the first mask layer disposed outside the second trench region, the following processes may be the same as the processes in the embodiments associated with FIGS. 6-38, which are not described herein.

In one embodiment, after forming the divided doped layer and implanting dopant ions into the first mask layer disposed outside the second trench region, the first trench may be formed. Before forming the first trench, the surface of the first mask layer may be flat, which may facilitate the exposure process of the first photoresist layer, and facilitate the exposure process of the second photoresist layer. Further, the dopant ions may be prevented from being implanted into the first adhesive layer, the bottom hard mask layer, the second adhesive layer and the layer 200 to-be-etched, and, thus, the process difficulty may be reduced.

Accordingly, the present disclosure also provides a semiconductor device formed by the above-disclosed methods In the disclosed method for forming the semiconductor device, after forming the divided doped layer and implanting dopant ions into the first mask layer disposed outside the second trench region, the mask sidewall spacer may be formed. Thus, neither the dopant ions for forming the divided doped layer nor the dopant ions implanted into the first mask layer disposed outside the second trench region, may not be implanted into the mask sidewall spacer. Therefore, the material of the mask sidewall spacer may not be affected, and the etching resistance of the mask sidewall spacer may be stable. In the process of removing the first mask layer in the second trench region by etching, the mask sidewall spacer may be used as a mask, therefore, the formed second trench may have a desired pattern quality, and the performance of the semiconductor device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor device, comprising:
providing a layer to-be-etched, wherein the layer to-be-etched includes first regions and second regions, alternately arranged along a first direction, a first region is in contact with an adjacent second region, and a second region includes a second trench region;
forming a first mask layer over the first regions and the second regions of the layer to-be-etched;
forming first trenches discretely in the first mask layer in the first regions;
forming a divided doped layer by implanting dopant ions into a portion region of the first mask layer in the second region, wherein the divided doped layer is disposed between adjacent first trenches in the first direction and divides the first mask layer in the second trench region in a second direction, and the second direction is perpendicular to the first direction;
implanting dopant ions into the first mask layer disposed outside the second trench region;
forming a mask sidewall spacer on a sidewall of a first trench after forming the divided doped layer and implanting the dopant ions into the first mask layer disposed outside the second trench region; and
after forming the mask sidewall spacer, removing the first mask layer in the second trench region by etching to form a second trench in the first mask layer in the second region, wherein the second trench is disposed on both sides of the divided doped layer in the second direction, and a sidewall of the second trench exposes the mask sidewall spacer.

2. The method according to claim 1, wherein:
the dopant ions include one or more of boron ions, arsenic ions, hydrogen ions, helium ions, and phosphorus ions.

3. The method according to claim 1, wherein:
the first mask layer is made of a material including one or more of amorphous silicon, polysilicon, crystal silicon, silicon oxide, and silicon nitride.

4. The method according to claim 1, wherein:
the divided doped layer is formed after forming the first trenches; and
the dopant ions are implanted into the first mask layer disposed outside the second trench region after forming the first trenches.

5. The method according to claim 4, wherein:
the divided doped layer is formed after implanting the dopant ions into the first mask layer disposed outside the second trench region.

6. The method according to claim 4, wherein:
the dopant ions are implanted into the first mask layer disposed outside the second trench region after forming the divided doped layer.

7. The method according to claim 4, wherein forming the divided doped layer includes:
forming a first planarization layer on the first mask layer, and in and over the first trenches;
forming a first bottom anti-reflective layer on the first planarization layer;
forming a patterned first photoresist layer on the first bottom anti-reflective layer, wherein the first photoresist layer contains a first photolithography opening, the first photolithography opening is disposed over the second region on a side of the first trench along the first direction, and the first photolithography opening is extended to a portion region of the first trench;
by using the first photoresist layer as a mask, etching the first bottom anti-reflective layer and the first planarization layer at a bottom of the first photolithography opening until a top surface of the first mask layer is exposed, wherein the first trench is filled with the first planarization layer;
by using the first photoresist layer and the first planarization layer as a mask, implanting the dopant ions into the first mask layer at the bottom of the first photolithography opening to form the divided doped layer; and
after implanting the dopant ions into the first mask layer at the bottom of the first photolithography opening, removing the first planarization layer, the first bottom anti-reflective layer, and the first photoresist layer.

8. The method according to claim 4, wherein implanting the dopant ions into the first mask layer disposed outside the second trench region includes:
forming a second planarization layer in and over the first trenches, and on the first mask layer;
forming a second bottom anti-reflective layer on the second planarization layer;
forming a patterned second photoresist layer on the second bottom anti-reflective layer, wherein the second photoresist layer covers the second bottom anti-reflective layer in the second trench region, and exposes the second bottom anti-reflective layer in the first region and the second bottom anti-reflective layer in the second region disposed around the second trench region;
by using the second photoresist layer as a mask, etching the second bottom anti-reflective layer and the second planarization layer until the top surface of the first mask layer is exposed, wherein the second planarization layer in the first trench is retained;
after etching the second bottom anti-reflective layer and the second planarization layer by using the second photoresist layer as a mask until the top surface of the first mask layer is exposed, implanting the dopant ions into the first mask layer disposed outside the second trench region by using the second photoresist layer as a mask; and
after implanting the dopant ions into the first mask layer disposed outside the second trench region by using the second photoresist layer as a mask, removing the second planarization layer, the second bottom anti-reflective layer and the second photoresist layer.

9. The method according to claim 1, wherein:
the first trench is formed after forming the divided doped layer and implanting the dopant ions into the first mask layer disposed outside the second trench region; or
the first trench is formed after implanting the dopant ions into the first mask layer disposed outside the second trench region, and the divided doped layer is formed after forming the first trench; or
the first trench is formed after forming the divided doped layer, and the dopant ions are implanted into the first mask layer disposed outside the second trench region after forming the first trench.

10. The method according to claim 1, wherein:
removing the first mask layer in the second trench region by etching includes one or more of a wet etching process and a dry etching process.

11. The method according to claim 1, wherein:
the mask sidewall spacer is made of a material including silicon oxide, silicon nitride, titanium oxide, titanium nitride, aluminum nitride, or aluminum oxide.

12. The method according to claim 1, further including:
after forming the divided doped layer and implanting the dopant ions into the first mask layer disposed outside the second trench region, forming a divided filling layer in the first trench, wherein the divided filling layer divides the first trench in the second direction; and
after forming the divided filling layer and the mask sidewall spacer, removing the first mask layer in the second trench region on both sides of the divided doped layer by etching.

13. The method according to claim 12, wherein:
the divided filling layer is formed after forming the mask sidewall spacer.

14. The method according to claim 12, wherein:
the mask sidewall spacer is formed after forming the divided filling layer.

15. The method according to claim 12, wherein:
the divided filling layer is formed when forming the mask sidewall spacer.

16. The method according to claim 15, wherein:
the divided filling layer is made of a material different from the mask sidewall spacer, wherein forming the mask sidewall spacer and the divided filling layer includes:
forming a sidewall spacer film on a sidewall and at a bottom of the first trench, on a top surface of the first mask layer, and on a surface of the divided doped layer,
after forming the sidewall spacer film, forming a barrier layer over the first mask layer and in one or more first trenches, wherein the barrier layer has a barrier opening exposing the first trench in the first direction and a portion of the first trench in the second direction, the barrier opening is connected to the exposed first trench and is extended to the second region in the first direction, and the barrier layer is further formed on the sidewall spacer film, after forming the barrier layer, forming a divided filling film in the barrier opening, in the first trench exposed by the barrier opening, and on the barrier layer, wherein the divided filling film is also formed over the sidewall spacer film, back-etching the divided filling film and the barrier layer until the surface of the sidewall spacer film disposed on the top surface of the first mask layer is exposed to form the divided filling layer, wherein back-etching the divided filling film and the barrier layer removes the barrier layer in the first trench, and after back-etching the divided filling film and the barrier layer, back-etching the sidewall spacer film until the top surface of the first mask layer is exposed to form the mask sidewall spacer.

17. The method according to claim 12, wherein:
the divided filling layer is made of a material including one or more of silicon oxide, silicon nitride, titanium oxide, titanium nitride, aluminum nitride, or aluminum oxide.

18. The method according to claim 12, wherein:
the divided doped layer has a size in the first direction in a range of approximately 10 nm-600 nm; and
the divided doped layer has a size in the second direction in a range of approximately 10 nm-400 nm.

19. The method according to claim 12, further including:
etching the layer to-be-etched at a bottom of the first trench to form a first target trench in the layer to-be-etched;
etching the layer to-be-etched at a bottom of the second trench to form a second target trench in the layer to-be-etched;
forming a first conductive layer in the first target trench; and
forming a second conductive layer in the second target trench.

20. A semiconductor device, comprising:
a substrate, including first regions and second regions that are alternately arranged along a first direction, a first region is in contact with an adjacent second region, and a second region includes a second trench region;
a first mask layer, disposed over the first regions and the second regions of the substrate;
discrete first trenches, disposed in the first mask layer in the first regions;
a divided doped layer, disposed between adjacent first trenches in the first direction;
a mask sidewall spacer, disposed on a sidewall of a first trench, wherein the mask sidewall spacer is formed after forming the divided doped layer and implanting dopant ions into the first mask layer disposed outside the second trench region; and
a second trench, disposed in the first mask layer in the second region, wherein the second trench is disposed on both sides of the divided doped layer in the second direction, and a sidewall of the second trench exposes the mask sidewall spacer.

* * * * *